(12) United States Patent
Akaike et al.

(10) Patent No.: US 10,141,887 B2
(45) Date of Patent: Nov. 27, 2018

(54) OSCILLATOR FOR DETECTING TEMPERATURE OF ATMOSPHERE

(71) Applicant: NIHON DEMPA KOGYO CO., LTD., Tokyo (JP)

(72) Inventors: Kazuo Akaike, Saitama (JP); Tsukasa Kobata, Saitama (JP); Tomoya Yorita, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 69 days.

(21) Appl. No.: 15/321,752

(22) PCT Filed: Jun. 23, 2015

(86) PCT No.: PCT/JP2015/068022
§ 371 (c)(1),
(2) Date: Dec. 23, 2016

(87) PCT Pub. No.: WO2015/199068
PCT Pub. Date: Dec. 30, 2015

(65) Prior Publication Data
US 2017/0133984 A1    May 11, 2017

(30) Foreign Application Priority Data

Jun. 25, 2014  (JP) ................................. 2014-130386
Oct. 31, 2014  (JP) ................................. 2014-223084

(51) Int. Cl.
*H03B 5/32*    (2006.01)
*H03L 7/08*    (2006.01)
(Continued)

(52) U.S. Cl.
CPC ................. *H03B 5/32* (2013.01); *H03B 5/04* (2013.01); *H03B 5/36* (2013.01); *H03L 1/02* (2013.01);
(Continued)

(58) Field of Classification Search
CPC .... H03B 5/32; H03B 5/04; H03B 2200/0034; H03B 5/36; H03L 7/24; H03L 7/099; H03L 1/02; H03L 1/028; H03L 7/08
(Continued)

(56) References Cited

U.S. PATENT DOCUMENTS

| 9,019,023 | B2 * | 4/2015 | Yorita | H03L 1/02 331/116 FE |
| 2008/0012655 | A1 * | 1/2008 | Stolpman | H03L 1/023 331/176 |
| 2010/0308930 | A1 * | 12/2010 | Ayazi | H03B 5/368 331/154 |

FOREIGN PATENT DOCUMENTS

| JP | H03-034284 | 2/1991 |
| JP | H08-032348 | 2/1996 |

(Continued)

OTHER PUBLICATIONS

"International Search Report (Form PCT/ISA/210)", dated Aug. 4, 2015, with English translation thereof, pp. 1-3.

*Primary Examiner* — Arnold Kinkead
(74) *Attorney, Agent, or Firm* — JCIRNET

(57) ABSTRACT

An oscillator detects a temperature of an atmosphere where a crystal resonator for an oscillation output is placed using a temperature detector to stabilize the temperature by controlling a temperature of a heater based on a temperature detection value. The device includes a buffer amplifier interposed in a signal path of a control signal generated based on the temperature detection value, a heater disposed such that a collector and an emitter position between a power source unit and a ground and constituted of a transistor having a base connected to an output port of the buffer amplifier, and a first differential amplifier disposed to adjust a gain of the buffer amplifier to cancel voltage fluctuation of the power source unit and amplifying a difference between (Continued)

a voltage corresponding to the supply voltage and a preliminarily set voltage to input to a gain adjustment port of the buffer amplifier.

9 Claims, 25 Drawing Sheets

(51) Int. Cl.
  *H03B 5/04* (2006.01)
  *H03L 1/02* (2006.01)
  *H03L 7/099* (2006.01)
  *H03L 7/24* (2006.01)
  *H03B 5/36* (2006.01)

(52) U.S. Cl.
  CPC ................ *H03L 1/028* (2013.01); *H03L 7/08* (2013.01); *H03L 7/099* (2013.01); *H03L 7/24* (2013.01); *H03B 2200/0034* (2013.01)

(58) Field of Classification Search
  USPC .................... 331/116 R, 1, 176, 158, 116 FE
  See application file for complete search history.

(56) References Cited

FOREIGN PATENT DOCUMENTS

| | | |
|---|---|---|
| JP | 2001-117645 | 4/2001 |
| JP | 2010-213102 | 9/2010 |
| JP | 2014-099689 | 5/2014 |

\* cited by examiner

US 10,141,887 B2

OSCILLATOR FOR DETECTING TEMPERATURE OF ATMOSPHERE

CROSS-REFERENCE TO RELATED APPLICATION

This application is a 371 application of the International PCT application serial no. PCT/JP2015/068022, filed on Jun. 23, 2015, which claims the priority benefits of Japan Patent Application No. 2014-130386, filed on Jun. 25, 2014, and Japan Patent Application No. 2014-223084, filed on Oct. 31, 2014. The entirety of each of the above-mentioned patent applications is hereby incorporated by reference herein and made a part of this specification.

TECHNICAL FIELD

This disclosure relates to an oscillator including a heater to execute temperature control of an atmosphere where a crystal resonator is placed.

BACKGROUND ART

As an oscillator for obtaining a highly accurate oscillation output, there has been known an oven controlled crystal oscillator (OCXO) including, for example, an oscillator circuit, a crystal resonator, a heater, and a temperature sensor in an oven. The heater is connected to an input terminal for inputting a supply voltage Vcc of the OCXO, for example. The temperature sensor detects a temperature in the oven and outputs a control voltage corresponding to the detected value to the heater. On the basis of this control voltage, a current flowing from the input terminal to the heater is controlled and a heater electric power is controlled so as to keep the temperature in the oven constant. This stabilizes an output frequency from the crystal resonator. That is, the oven is configured to be a constant temperature oven.

The heater, for example, includes a PNP-type transistor or an NPN-type transistor. The control voltage is applied to bases of these transistors. In the case where the PNP-type transistor is used, the input terminal of the supply voltage is connected to an emitter and in the case where the NPN-type transistor is used, the input terminal of the supply voltage is connected to a collector. As described in the embodiment, the heater electric power is a current supplied to these transistors×Vcc.

A supply voltage Vcc may fluctuate. When the supply voltage Vcc thus fluctuates, the heater electric power fluctuates in association with it and the temperature in the constant temperature oven fluctuates. As the result, stability of the oscillation frequency deteriorates. In order to prevent this fluctuation of the heater electric power, it is possible to dispose a regulator between the input terminal and the heater to keep a voltage applied to the heater constant; however, a heat generation caused by voltage drop in this regulator becomes large because the heater requires a current larger than other circuit components to flow. This fails the temperature control when a set temperature in the constant temperature oven is set to a comparatively high temperature.

Patent Document 1 describes a temperature control circuit including the above-described heater and temperature sensor and shows that this temperature control circuit is applied to the OCXO. However, in this Patent Document 1, the temperature sensor is constituted of a thermistor, which is difficult to expect an improvement of frequency accuracy of the OCXO due to a limit of temperature detection accuracy of this thermistor.

CITATION LIST

Patent Document

Patent Document 1: Japanese Unexamined Patent Application Publication No. 2001-117645

SUMMARY OF THE DISCLOSURE

Problems to be Solved by the Disclosure

The disclosure has been made under such circumstances, and provides a technique that ensures reducing fluctuation of an oscillation frequency caused by voltage fluctuation of a power source unit of a heater in an oscillator including the heater heating an atmosphere where a crystal resonator s placed.

Solutions to the Problems

An oscillator of the disclosure detects a temperature of an atmosphere where a crystal resonator for an oscillation output is placed using a temperature detector to stabilize the temperature by controlling a temperature of a heater based on a temperature detection value. The oscillator includes: a buffer amplifier interposed in a signal path of a control signal generated based on the temperature detection value; a heater constituted of a transistor having a collector and an emitter positioned between a power source unit and a ground and a base connected to an output port of the buffer amplifier; and a first differential amplifier disposed to adjust a gain of the buffer amplifier so as to cancel voltage fluctuation of the power source unit and amplifying a difference between a voltage corresponding to the supply voltage and a preliminarily set voltage to input to a gain adjustment port of the buffer amplifier.

Another oscillator of the disclosure detects a temperature of an atmosphere where a crystal resonator for an oscillation output is placed using a temperature detector to stabilize the temperature by controlling a temperature of a heater based on a temperature detection value. The oscillator includes: an addition unit that takes out a difference between the temperature detection value and a temperature target value; a heater constituted of a heat resistor connected to a power source unit supplying a positive voltage and a PNP-type transistor having an emitter connected to the power source unit via the heat resistor and a collector grounded; a constant voltage supply unit for supplying a preliminarily set voltage; a differential amplifier having an output port connected to a base of the PNP-type transistor; a first voltage dividing resistor and a second voltage dividing resistor disposed being connect in series with one another between the constant voltage supply unit and between the heat resistor and the emitter; a third voltage dividing resistor interposed between the addition unit and a positive input port of the differential amplifier; and a fourth voltage dividing resistor connected to between the power source unit and the heat resistor and between the positive input port of the differential amplifier and the third voltage dividing resistor. A negative input port of the differential amplifier is connected to between the first voltage dividing resistor and the second voltage dividing resistor.

Effects of the Disclosure

The oscillator of the disclosure includes the buffer amplifier interposed in the signal path of the control signal generated based on the temperature detection value, the heater constituted of the transistor having the base connected to the buffer amplifier, and the differential amplifier disposed to adjust the gain of the buffer amplifier and amplifying the difference between the voltage corresponding to the supply voltage and the voltage that is preliminarily set to input to the gain adjustment port of the buffer amplifier. Such a configuration ensures applying the current to the transistor so as to cancel voltage fluctuation of the power source unit connected to the emitter or the collector of the transistor. Thereby fluctuation of oscillation frequency can be reduced.

Another oscillator of the disclosure includes the addition unit that takes out the difference between the temperature detection value and the temperature target value, the heater constituted of the heat resistor connected to the power source unit supplying a positive voltage and the PNP-type transistor having the emitter connected to the power source unit via this heat resistor and the collector grounded, the constant voltage supply unit for supplying the preliminarily set voltage, the differential amplifier having the output port connected to the base of the PNP-type transistor. Such a configuration ensures reducing fluctuation of oscillation frequency by applying the current to the heat resistor and the transistor so as to cancel voltage fluctuation of the power source unit.

DESCRIPTION OF PREFERRED EMBODIMENTS

First Embodiment

Figure 1:
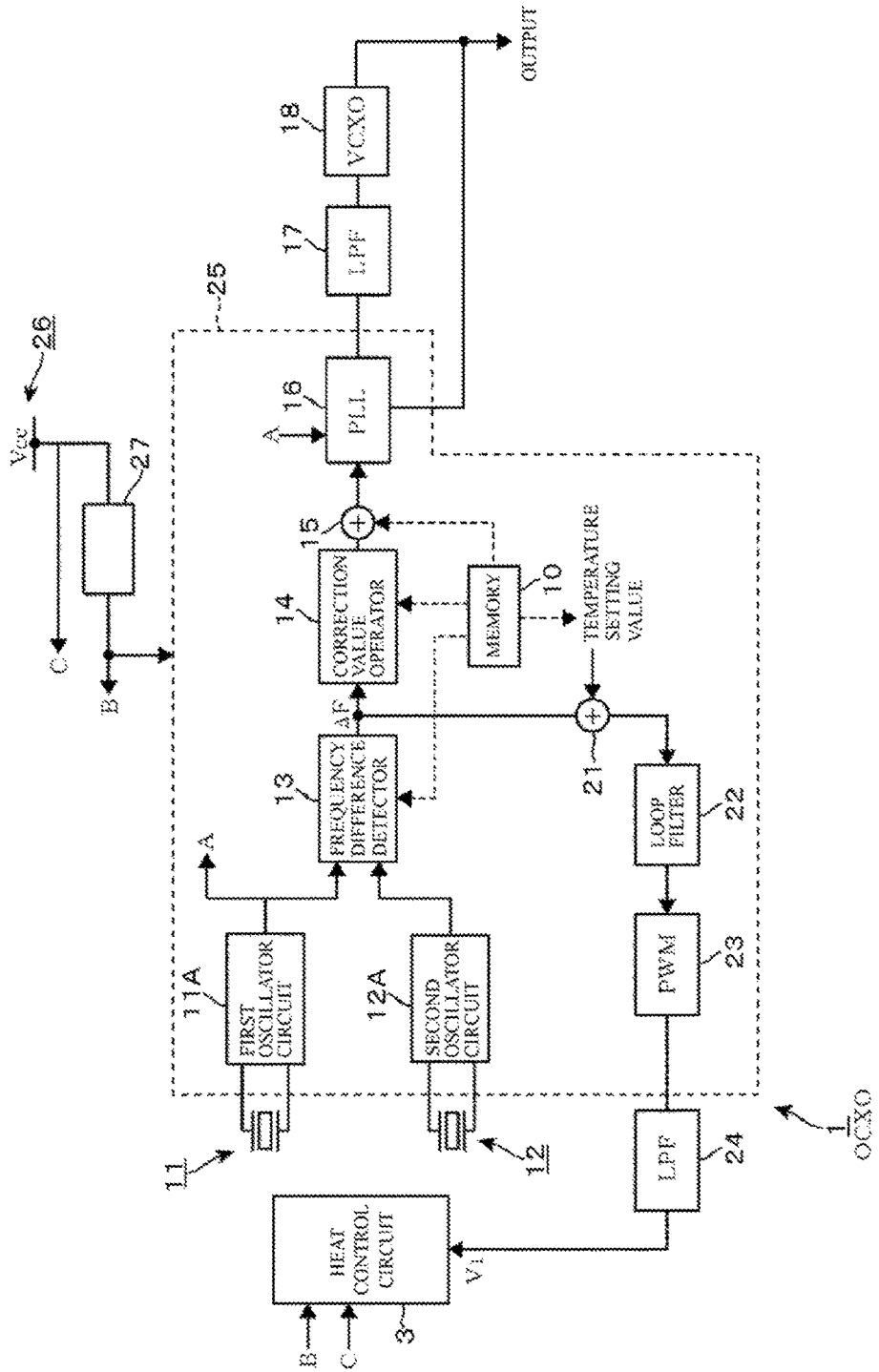
FIG. 1 is a block diagram of an OCXO according to a first embodiment of the disclosure.

FIG. 1 is a block diagram illustrating an OCXO 1 according to an embodiment of the disclosure. The OCXO 1 includes a first crystal resonator 11, a second crystal resonator 12, and a first oscillator circuit 11A and a second oscillator circuit 12A that oscillate these crystal resonators. The first oscillator circuit 11A is constituted of, for example, a Colpitts oscillation circuit. In a latter part side of the first oscillator circuit 11A and the second oscillator circuit 12A, a frequency difference detector 13, a correction value operator 14, an addition unit 15, a PLL circuit unit 16, a low-pass filter (LPF) 17, and a voltage controlled crystal oscillator (VCXO) 18 are connected. Each of these circuits is disposed in a constant temperature oven.

The PLL circuit unit 16 treats an oscillation output from the first oscillator circuit 11A as a clock signal. The PLL circuit unit 16 converts a signal corresponding to a phase difference between a pulse signal that is generated on a basis of a frequency setting signal, which is a digital value, and a feedback pulse from the VCXO 18 into an analog signal, integrates the analog signal, and outputs to the low-pass filter 17. The output of the VCXO 18 is the oscillation output of the OCXO 1.

A value corresponding to a frequency difference $\Delta F$ between an oscillation output f1 from the first oscillator circuit 11A and an oscillation output f2 from the second oscillator circuit 12A corresponds to a temperature of an atmosphere where the crystal resonators 11 and 12 are placed. This value is referred to as a temperature detection value. For convenience of explanation, f1 and f2 also represent the oscillation frequencies of the first oscillator circuit 11A and the second oscillator circuit 12A, respectively. The frequency difference detector 13, in this example, extracts a value of $\{(f2-f1)/f1\} - \{(f2r-f1r)/f1r\}$, which corresponds to the temperature detection value being in a proportional relation to the temperature. The values f1$r$ and f2$r$ are the oscillation frequency of the first oscillator circuit 11A and the oscillation frequency of the second oscillator circuit 12A at a reference temperature of, for example, 25° C., respectively.

The correction value operator 14 calculates a frequency correction value on a basis of a relation between the temperature detection value and a pre-established frequency correction value. The frequency correction value is a value for compensating fluctuation when the temperature of the first crystal resonator 11 fluctuates from a target temperature, that is, fluctuation in temperature of the clock signal. The addition unit 15 is input with this frequency correction value and a setting value stored in a memory 10, which are added to one another to configure a frequency setting signal. Then, this frequency setting signal is input from the addition unit 15 to the PLL circuit unit 16. Changing a control voltage Vc changes the frequency setting signal that is output from the addition unit 15 to the PLL circuit unit 16. This changes an oscillation output frequency of the OCXO 1.

For more details, the PLL circuit unit 16 includes a Direct Digital Synthesizer (DDS) circuit unit, a frequency divider, and a phase comparator. A reference clock is formed on a basis of a sawtooth wave output from the DDS circuit unit. The phase comparator compares a phase of an output signal divided the output of the VCXO 18 and the reference clock. Then, the comparison result is output to the LPF 17. The output of the VCXO 18 is controlled by the output from the LPF 17. The DDS circuit unit uses a frequency signal output from the first oscillator circuit 11A as a reference clock and is input with a control voltage in order to output the sawtooth wave of the target frequency. However, since the frequency of the reference clock has a temperature characteristic, the control voltage input to the DDS circuit unit is added to a signal corresponding to the frequency correction value from the addition unit 15 in order to cancel this temperature characteristic. Thus, the OCXO 1 is also constituted as a TCXO. The OCXO 1 is constituted as a device that can stabilize the output at high accuracy on which a dual temperature control by the operation of a heat generation circuit described later and frequency correction by this correction value operator 14 is performed.

The relation between the temperature detection value and the frequency correction value is stored in the memory 10. For example, assuming that $(f2-f2r)/f2r=OSC2$, $(f1-f1r)/f1r=OSC1$, the relationship between (OSC2−OSC1) and the temperature is obtained by actual measurement when the crystal resonator is produced. From this measurement data, a frequency correction curve for cancelling the frequency variation amount relative to the temperature is obtained. Then, the coefficient of the ninth-order polynomial approximation formula is calculated using the least squares method. The coefficients of the polynomial approximation formula are preliminarily stored in the memory 10. The correction value operator 14 uses these coefficients of the polynomial approximation formula to execute operation processing of the correction value.

Furthermore, the temperature detection value is output from the frequency difference detector 13 to an addition unit 21. In the addition unit 21, this temperature detection value and the setting value (the target temperature value) stored in the memory 10 are added to one another. A control signal, which is this added value, is output to a loop filter 22 and integrated. Then, the integral value is output to a PWM circuit 23.

The PWM circuit 23 converts a 14-bit digital signal (two's-complement from $-2^{13}$ to $+2^{13}$) into representation of a pulse signal during a certain period of time. For example, when the minimum H pulse width is 10 nsec, a digital signal is expressed with a pulse number during a certain period of time, which is $2^{14}*10^{-9}=16.384$ msec. Specifically, the pulse numbers are expressed as follows. The number of H pulses during 16.384 msec is $2^{13}$ when a 14-bit digital value is zero; the number of H pulses during 16.384 msec is zero when a 14-bit digital value is $-2^{13}$; and the number of H pulses during 16.384 msec is $2^{14}-1$ when a 14-bit digital value is $2^{13}-1$. That is, the PWM circuit 23 has a role to convert a digital value into an analog value.

At a subsequent stage of the PWM circuit 23, a low-pass filter (LPF) 24 is disposed. The LPF 24 averages outputs from the PWM circuit 23, and outputs a DC voltage corresponding to the number of pulses, which is this output, to a heat control circuit 3, which will be described later. Schematically, an operation circuit is disposed between the frequency difference detector 13 and the heat control circuit 3 so as to output a voltage V1 for compensating a deviation between the temperature inside the constant temperature oven and the set temperature on the basis of the $\{(f2-f1)/f1\}-\{(f2r-f1r)/f1r\}$ in respective cases where the temperature inside the constant temperature oven, which is the casing, is higher than the set temperature and where the temperature is lower than the set temperature.

The oscillator circuits 11A and 12A, the frequency difference detector 13, the correction value operator 14, the addition unit 15, the PLL circuit unit 16, the LPF 17, the addition unit 21, the loop filter 22, and the PWM circuit 23 are included in an integrated circuit 25. Reference numeral 26 in the drawing denotes a terminal to which the supply voltage Vcc of the OCXO 1 is input and a voltage of 3.3 V is applied from the outside of the OCXO 1. A regulator 27 is disposed in a line between the supply voltage input terminal 26, which constitutes a power source unit, and the integrated circuit 25. The regulator 27 is a constant voltage supply unit that stabilizes a voltage. This regulator 27 supplies the supply voltage of 3 V to each of the above-described circuits that constitute the integrated circuit 25. Therefore, the voltage V1 output from the LPF 24 to the heat control circuit 3 does not fluctuate by fluctuation of the supply voltage Vcc. The output of the regulator 27 is supplied to the heat control circuit 3.

The integrated circuit 25, the crystal resonators 11 and 12, the LPFs 17 and 24, the VCXO 18, and the heat control circuit 3 are housed in a casing. Inside of this casing is controlled to keep a constant temperature by heat generation of a transistor of the heat control circuit 3. That is, the casing is constituted as the constant temperature oven to control ambient temperatures of the crystal resonators 11 and 12 constant such that stable oscillation outputs are obtained from the crystal resonators 11 and 12.

Figure 2:
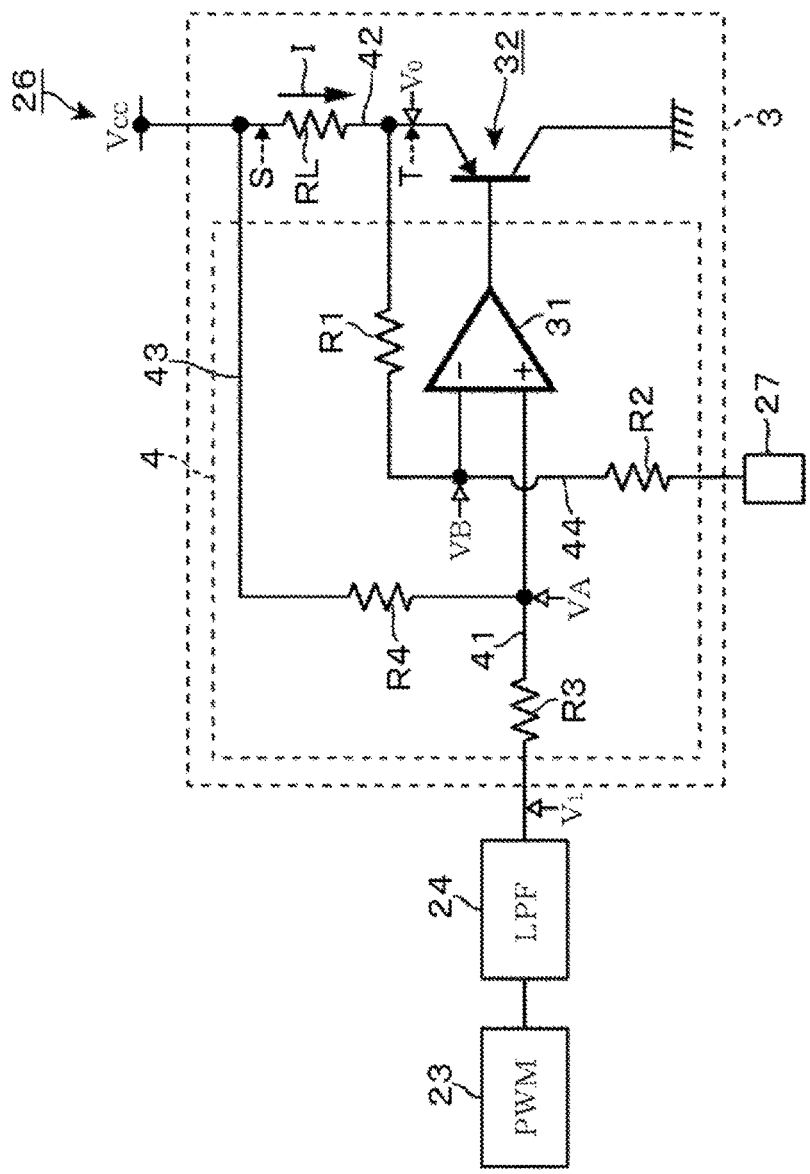
FIG. 2 is a circuit diagram of a heat control circuit included in the OCXO.

Next, the heat control circuit 3 will be described with reference to a block diagram in FIG. 2. The heat control circuit 3 includes a differential amplifier 31 and a PNP-type transistor 32. An analog voltage output from the LPF 24 is input to an input terminal on a + side of this differential amplifier 31 via a signal path 41 that works as a signal path of a control signal. The signal path 41 interposes a resistor R3 that is a third voltage dividing resistor. An output port of the differential amplifier 31 is connected to a base of the PNP-type transistor 32 and applies a control voltage. A collector of the PNP-type transistor 32 is grounded. A supply voltage input terminal 26 is connected to an emitter of the PNP-type transistor 32 via a signal path 42. The signal path 42 interposes a heating resistor RL. The PNP-type transistor 32 and the heating resistor RL constitute a heater.

A signal path 43 connecting between the supply voltage input terminal 26 and the heat resistor RL and between the resistor R3 and the input terminal on the + side of the differential amplifier 31 is disposed. The signal path 43 interposes a resistor R4 that is a fourth voltage dividing resistor. A signal path 44 connecting a constant voltage supply unit 27 and between the heat resistor RL and the emitter of the PNP-type transistor 32 in the signal path 42 is disposed. This signal path 44 includes a resistor R1, which is a first voltage dividing resistor, and a resistor R2, which is a second voltage dividing resistor, in series.

The differential amplifier 31 and each of the resistors R1 to R4 constitute a control voltage supply circuit 4. This control voltage supply circuit 4 works as a voltage fluctuation reducing unit for supplying the control voltage to this PNP-type transistor 32 such that fluctuation of a heater electric power P is compensated. The heater electric power P is a sum of an electric power supplied to the PNP-type transistor 32 and an electric power supplied to the heating resistor RL caused by fluctuation of the supply voltage Vcc. The heater electric power P=Vcc×I, and this I is a current supplied to the respective heat resistor RL and emitter of the PNP-type transistor 32. In FIG. 2, a voltage supplied from the LPF 24 to the heat control circuit 3 is illustrated as V1. The heat control circuit 3 is configured such that this heater electric power P maintains a constant value by compensating the fluctuation of the heater electric power P even if the supply voltage Vcc fluctuates while this V1 is constant.

Giving a supplementary explanation about the above-described heater electric power P, the heater electric power P is, a voltage supplied to the heating resistor RL×a current I supplied to the heating resistor RL (=an electric power supplied to the heating resistor RL)+a voltage supplied to the PNP-type transistor 32×a current I supplied to the PNP-type transistor 32 (=an electric power supplied to the PNP-type transistor 32). However, as illustrated in evaluation tests described later, the electric power supplied to the heating resistor RL is considerably small compared with the electric power supplied to the PNP-type transistor 32.

Next, an operation of the heat control circuit 3 will be described. Here, an example in which the supply voltage Vcc set to 2 V fluctuates to 2.2 V will be described with the assumption that the output voltage V1 from the LPF 24 is constant at, for example, 1 V. The heater electric power P is controlled to 1 W. For convenience of explanation, a voltage supplied to the emitter of the PNP-type transistor 32 in FIG. 2 is described as a voltage V0 when the supply voltage Vcc is 2 V and as a voltage V0' when he supply voltage Vcc is 2.2 V. A voltage input to the + side of the differential amplifier 31 is VA, and a voltage input to a − side is VB.

When Vcc is 2 V, P=Vcc×I (formula 1); therefore, in order to set the heater electric power P to 1 W, I=½=0.5 A. I=(Vcc−V0)/RL (formula 2); therefore, I=(2−V0)/RL. Accordingly, 0.5 A=(2−V0)/RL, and modifying this formula sets V0=2−0.5 RL (formula 3).

When Vcc is 2.2 V, from formula 1, I=1/2.2≈0.46 A. From formula 2, I=(2.2−V0')/RL. Accordingly, 0.46 A=(2.2−V0')/RL; therefore, V0'=2.2 −0.46 RL (formula 4). From formula 3 and formula 4, when Vcc fluctuates from 2 V to 2.2 V, V0 is required to increase by (2.2−0.46 RL)−(2−0.5 RL)=(0.2+0.04 RL) V. To summarize, when Vcc increases from 2 V to 2.2 V, the input voltages VA and VB to the differential amplifier 31 both increase, but the increasing rates of VA and VB are different from one another. As the result, a base electric potential of the PNP-type transistor 32 decreases by the increase of VA and VB, thus circuit constants of the respective components are determined such that the emitter voltage V0 of the PNP-type transistor 32 increases by (0.2+0.04 RL) V.

When Vcc decreases from 2.0 V, the emitter voltage V0 decreases corresponding to this decrease, thereby the heater electric power is maintained to be 1 W. As described above, the output voltage Vp from the LPF 24 corresponds to a detected value of the ambient temperatures of the crystal resonators 11 and 12. Since this output voltage Vp is input to the differential amplifier 31, the output from the differential amplifier 31 fluctuates by fluctuation of this temperature detection value. Thus, controlling the heater electric power P on the basis of a voltage corresponding to the temperature detection value and a voltage corresponding to the supply voltage Vcc controls the ambient temperatures of the crystal resonators 11 and 12 to be constant.

A correlation between OSC2-OSC1, which is the output of the frequency difference detector 13 described above, and the temperature is significantly high. The OCXO 1 controls a heat generation amount of the PNP-type transistor 32 by inputting the output from this OSC2-OSC1 and the output corresponding to the supply voltage Vcc to the differential amplifier 31, supplying this output of the differential amplifier 31 to the base of the PNP-type transistor 32, and controlling the current flowing through the PNP-type transistor 32. Accordingly, the heat generation amount of the PNP-type transistor 32 corresponds to the ambient temperatures of the crystal resonators 11 and 12 with high accuracy, and according to fluctuation of the supply voltage, the heat generation amount of the PNP-type transistor 32 is controlled so as to compensate the temperature change caused by the fluctuation. Thereby ensuring highly accurately controlling the ambient temperature to be the set temperature and stabilizing the oscillation output of the OCXO 1.

Second Embodiment

Figure 3:
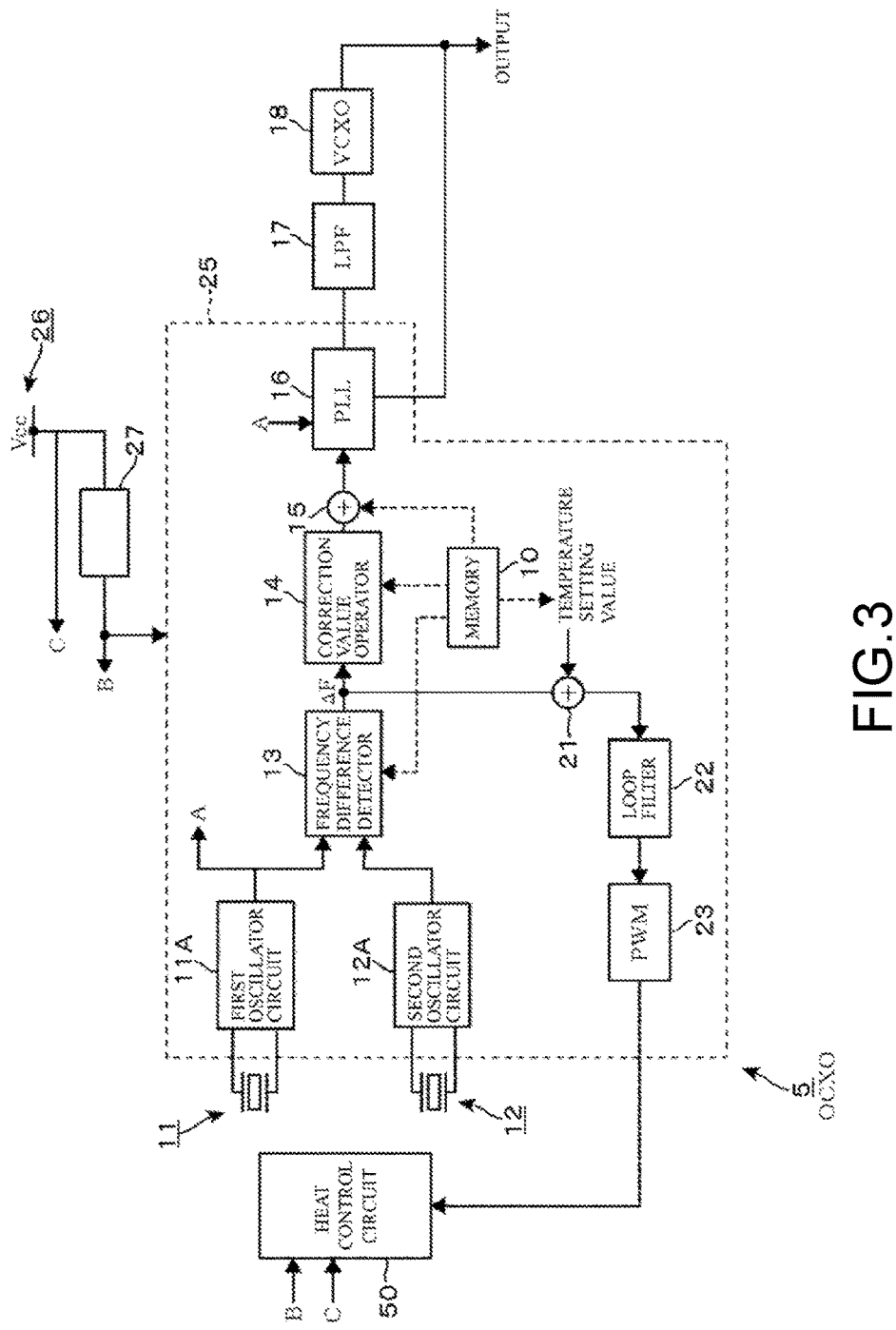
FIG. 3 is a block diagram of an OCXO according to a second embodiment of the disclosure.

An OCXO 5 according to a second embodiment will be described focusing on differences with the OCXO 1. As a difference in this OCXO 5 with respect to the OCXO 1, a heat control circuit 50 is included at a latter part of the PWM circuit 23 as illustrated in FIG. 3. The LPF 24 disposed at the latter part of the PWM circuit 23 in the first embodiment is included in the heat control circuit 50 as described later.

Figure 4:
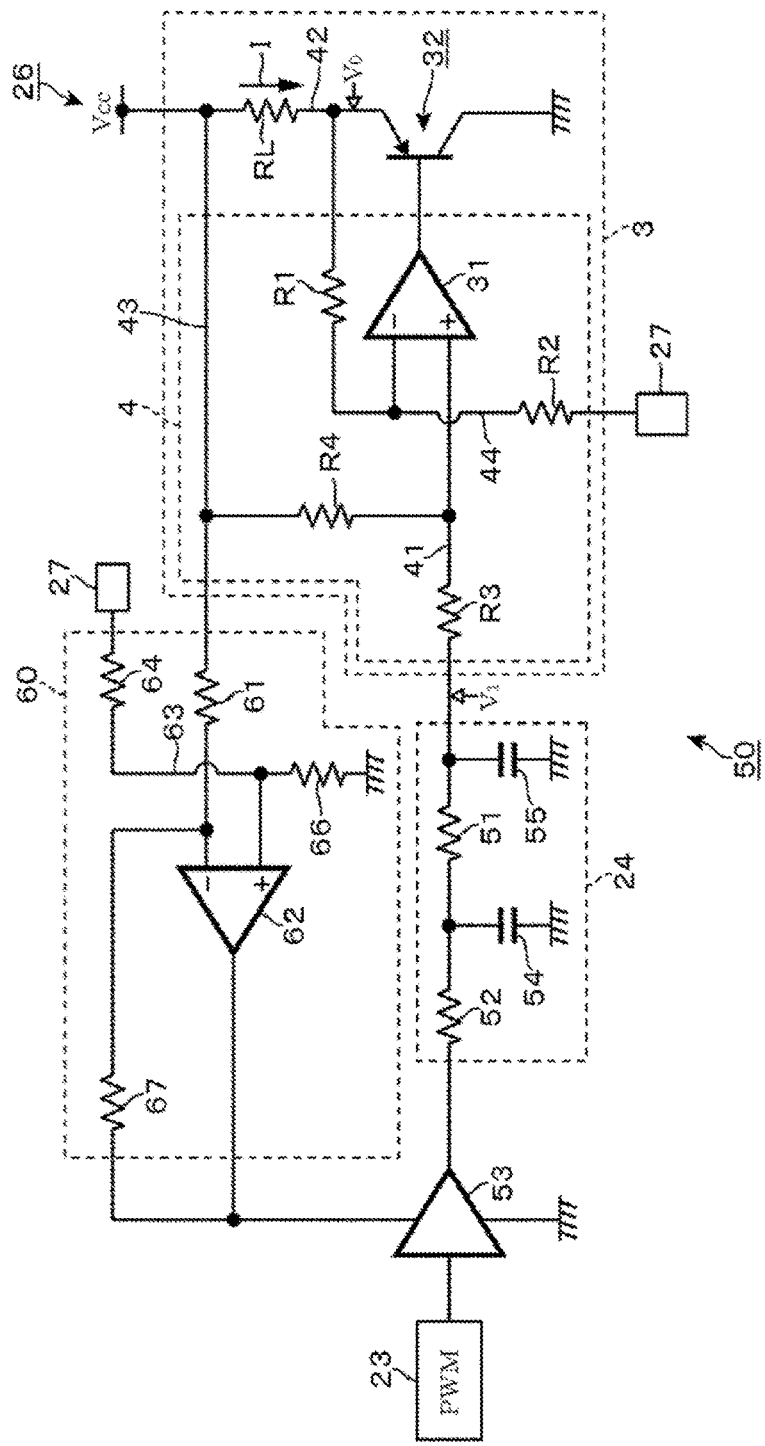
FIG. 4 is a circuit diagram of a heat control circuit included in the OCXO.

FIG. 4 is a block diagram of the heat control circuit 50. This heat control circuit 50 includes the heat control circuit 3 described in the first embodiment. Similar to the first embodiment, even in the heat control circuit 3 of this second embodiment, when a voltage applied to the input terminal on the + side of the differential amplifier 31 and a voltage applied to the input terminal on the − side both increase due to an increase of the supply voltage Vcc, resistance values of the respective resistors R are set such that an increase rate of the voltage applied to the input terminal on the + side becomes larger than an increase rate of the voltage applied to the input terminal on the − side.

The signal path 41, which constitutes the heat control circuit 3, has the other end connected to the PWM circuit 23 via a resistor 51, a resistor 52, and an output port and an input port of a buffer amplifier 53 in this order. Grounded condensers 54 and 55 are disposed between the resistors 51 and 52 and between the resistors 51 and R3. These resistors 51 and 52 and condensers 54 and 55 constitute the above-described LPF 24.

The signal path 43, which connects the supply voltage input terminal 26 and the signal path 41, branches. This branch end is connected to an input terminal on a − side of a differential amplifier 62 via a resistor 61. A signal path 63 that connects the regulator 27 and an input terminal on a + side of the differential amplifier 62 is disposed. The signal path 63 interposes a resistor 64. In the signal path 63, a resistor 66 having one end grounded has the other end connected between the resistor 64 and the differential amplifier 62. An output port of the differential amplifier 62 is connected so as to supply a supply voltage to a gain adjustment port (not illustrated) of the buffer amplifier 53. One end of a resistor 67 is connected between the output port of the differential amplifier 62 and the buffer amplifier 53, and the other end of the resistor 67 is connected between the input terminal on the − side of the differential amplifier 62 and the resistor 61. The differential amplifier 62 and the resistors 61, 64, 66 and 67 constitute a supply voltage supply circuit 60 for supplying a supply voltage from the supply voltage input terminal 26 to the buffer amplifier 53.

Figure 5:
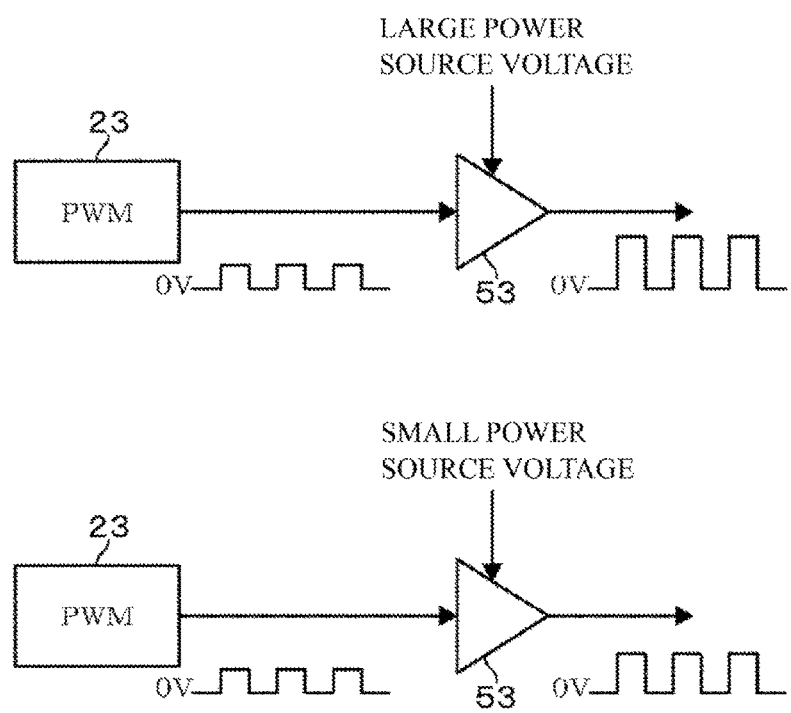
FIG. 5 is a schematic diagram illustrating a state of signal change.

The buffer amplifier 53 is grounded. Impedance on the input side of this buffer amplifier 53 is configured to be infinity and impedance on the output side is configured to be 0 to prevent a signal from flowing backward from the LPF 24 to a PWM circuit 23. As illustrated in a schematic diagram in FIG. 5, a voltage signal of a rectangular wave is output from the PWM circuit 23. The buffer amplifier 53 amplifies the rectangular wave to output to the LPF 24. A gain of this amplification fluctuates by fluctuation of the supply voltage supplied from the supply voltage supply circuit 60 to the gain adjustment port of this buffer amplifier 53. The larger the supply voltage is, the larger the gain is. The LPF 24 averages the output from the buffer amplifier 53 and outputs a DC voltage corresponding to a duty ratio of this output and a level of the rectangular wave to the control voltage supply circuit 4.

In the heat control circuit 3, the heater electric power P=Vcc×I as described above, thus, the correspondence of the heater electric power P and the supply voltage Vcc is in a proportional relation. The relation between V1, which is an output voltage of the LPF 24, and the heater electric power P is also represented in a proportional relation. Since the output voltage V1 corresponds to a duty ratio of output of the PWM circuit 23, this duty ratio and the heater electric power P are also represented in a proportional relation. This proportional relation does not fluctuate even though Vcc fluctuates. Assume that the output from the PWM circuit 23 is constant, then the supply voltage Vcc increases from a predetermined value, for example, by 10% of this predetermined value, thereby the heater electric power P increases with respect to a predetermined value by 10% of this predetermined value. Then, the output voltage from the supply voltage supply circuit 60 is controlled so as to be able to obtain an output to decrease the heater electric power by the increased 10% from the buffer amplifier 53, and this heater electric power is controlled to be constant.

The following describes an operation of the heat control circuit 50 of the second embodiment. When the supply voltage Vcc increases from the predetermined value, a voltage supplied to the input terminal on the − side of the differential amplifier 62 in the supply voltage supply circuit 60 increases, and a supply voltage supplied from the differential amplifier 62 to the buffer amplifier 53 decreases. Thereby the output from the buffer amplifier 53 decreases and the output voltage V1 from the LPF 24 decreases. This decreased amount of the output voltage V1 corresponds to the increased amount of the supply voltage Vcc. Then, the base electric potential of the PNP-type transistor 32 decreases by the decreased amount of the output voltage V1. Therefore, the emitter voltage V0 of the PNP-type transistor 32 increases to compensate the fluctuation of the heater electric power P. Thereby the temperature inside the constant temperature oven constituting the OCXO 5 is kept at the set temperature.

When the supply voltage Vcc decreases from the predetermined value, a voltage supplied to the input terminal on the − side of the differential amplifier 62 in the supply voltage supply circuit 60 decreases, and a supply voltage supplied from the differential amplifier 62 to the buffer amplifier 53 increases. Thereby the output from the buffer amplifier 53 increases and the output voltage V1 from the LPF 24 increases. This increased amount of the output voltage V1 corresponds to the decreased amount of the supply voltage Vcc. Then, the base electric potential of the PNP-type transistor 32 increases by the increased amount of the output voltage V1. Therefore, the emitter voltage V0 of the PNP-type transistor 32 decreases to compensate the fluctuation of the heater electric power P. Thereby the temperature inside the constant temperature oven constituting the OCXO 5 is kept at the set temperature.

The OCXO 5 of this second embodiment can reduce, similarly to the OCXO 1, fluctuation of the heater electric power caused by fluctuation of the supply voltage Vcc applied to the supply voltage input terminal 26 by including such heat control circuit 50. Therefore, the temperature inside the constant temperature oven is controlled with high accuracy to be the set temperature and the oscillation output can be stabilized with high accuracy. As shown in experiments described later, the OCXO 5 can stabilize the heater electric power in a temperature range in the constant temperature oven wider than that of the OCXO 1.

Figure 6:
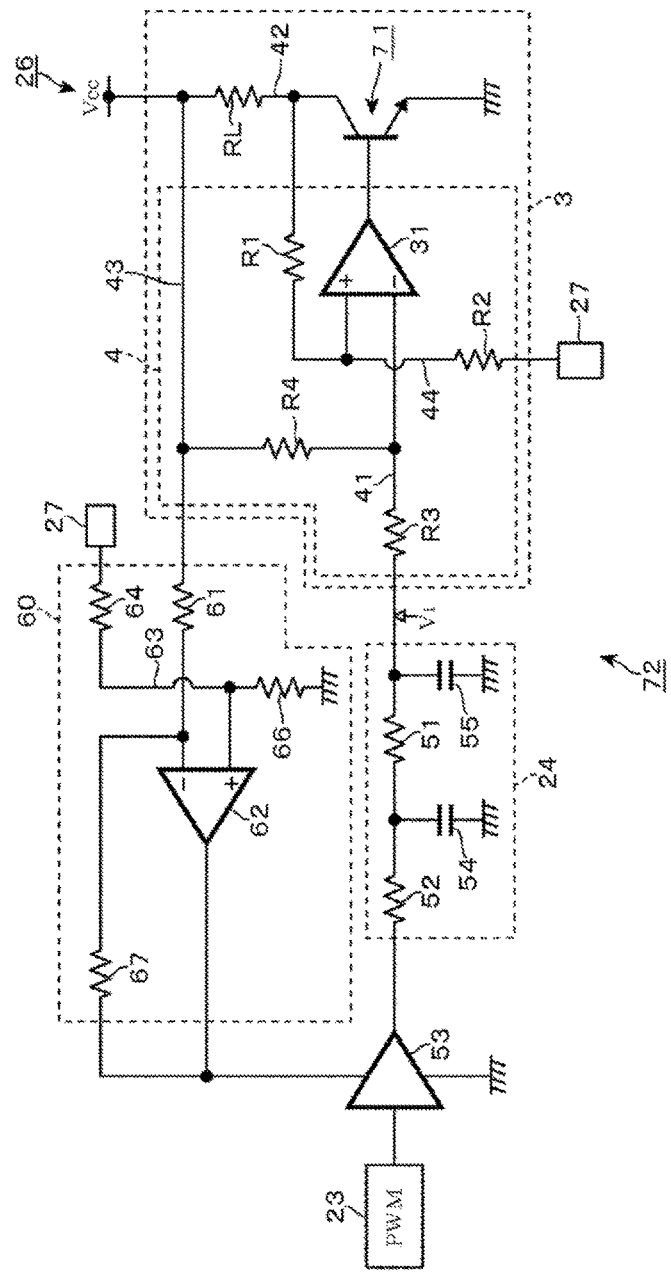
FIG. 6 is a circuit diagram illustrating a modification of the heat control circuit included in the second embodiment.

The heat control circuit of the second embodiment may include an NPN-type transistor 71 instead of the PNP-type transistor 32. FIG. 6 illustrates an example of a heat control circuit 72 including the NPN-type transistor 71 in such a fashion. A collector of the NPN-type transistor 71 is connected to the supply voltage input terminal 26 via the heating resistor RL and an emitter of the NPN-type transistor 71 is grounded. Another difference from the heat control circuit 50 of the second embodiment includes the signal path 41, namely the buffer amplifier 53 and a low-pass filter 24, is connected to the input terminal on the − side of the differential amplifier 31 and the signal path 42 connected to the supply voltage input terminal 26 is connected to the input terminal on the + side of the differential amplifier 31.

Also with this heat control circuit 72, by a similar operation to the above-described heat control circuit 50, fluctuation of the heater electric power P is compensated when the supply voltage Vcc fluctuates. That is, the supply voltage Vcc fluctuating from the predetermined value changes the output from the buffer amplifier 53 and the base electric potential of the NPN-type transistor 71 to change the emitter voltage of the NPN-type transistor 71, thereby the heater electric power P becomes constant. In this example, the current I of the heater electric power P=Vcc×I is a current applied to the emitter of the NPN-type transistor 71.

Figure 7:
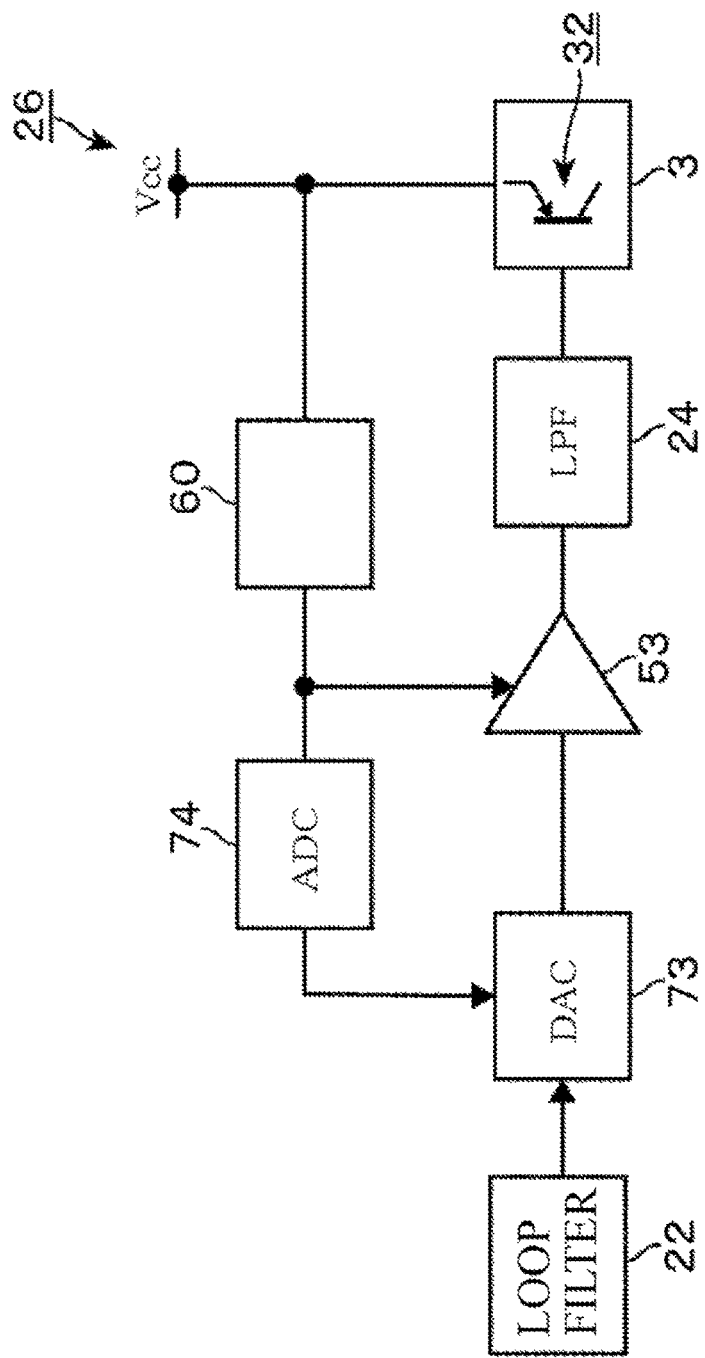
FIG. 7 is a block diagram illustrating a modification of the OCXO of the second embodiment.

As described above, while the PWM circuit 23 has a role to output a digital signal by converting into an analog signal, a circuit that can execute the digital-analog conversion in such a manner may be disposed instead of the PWM circuit 23. FIG. 7 illustrates an example where a digital-analog converter (DAC) 73 is disposed instead of the PWM circuit 23 in the OCXO 5 of the second embodiment. This DAC 73 is supplied with an output from the above-described loop filter 22 and a signal from the supply voltage supply circuit 60 converted into a digital value by an analog-digital converter (ADC) 74 as a reference signal. At the DAC 73, the output from the loop filter 22, a voltage value of the reference signal, and a gain preliminarily set are multiplied. Then, a voltage corresponding to this multiplication value is supplied to the buffer amplifier 53.

Evaluation Test 1-1

The following describes evaluation tests performed in relation with the disclosure. As the evaluation test 1-1, a test that measures a frequency deviation obtained from an oscillation output frequency of an OCXO (referred to as a test OCXO) that is constituted approximately similar to the OCXO 1 described in the first embodiment and a current value output from the collector of the PNP-type transistor 32 was performed. Since this test OCXO does not include the control voltage supply circuit 4 at a latter part of the LPF 24, the output voltage of the LPF 24 is supplied to the PNP-type transistor 32 without being adjusted at this control voltage supply circuit 4. The measurement was performed with the supply voltage Vcc fluctuating in a range of 3.3 V±2.5%.

Figure 8:
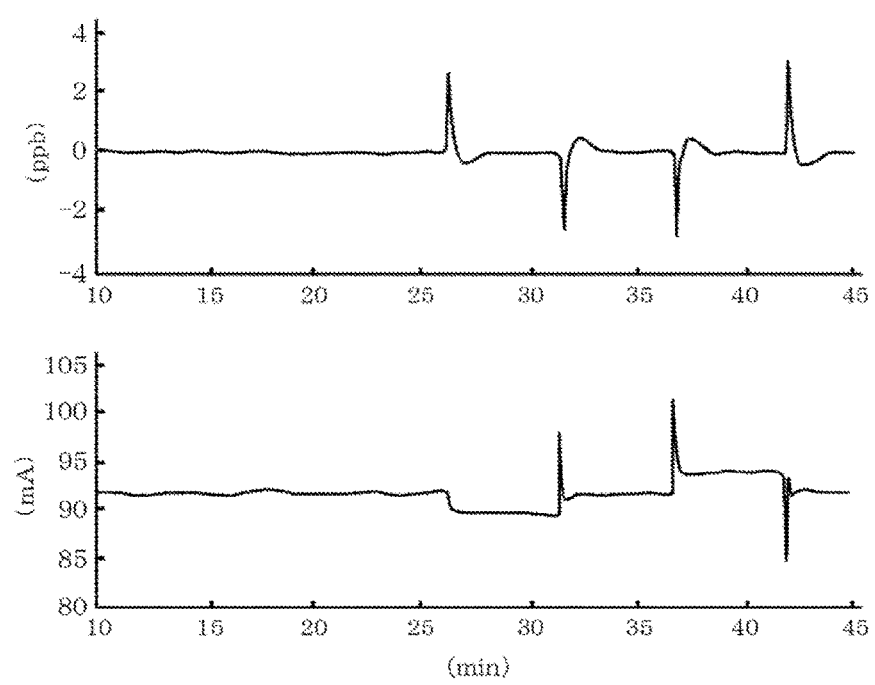
FIG. 8 is a graph illustrating a result of an evaluation test.

In FIG. 8, a graph on an upper side illustrates a state in which the frequency deviation fluctuates, and a graph on a lower side illustrates a state in which the value of the output current from the collector fluctuates. The frequency deviation is ((reference frequency−measured frequency)/reference frequency). A vertical axis of the graph on the upper side indicates this frequency deviation (unit: ppb), a vertical axis of the graph on the lower side indicates the current value (unit: mA), respectively. Horizontal axes of the respective graphs indicate an elapsed time (unit: minute) from a predetermined time. As illustrated in the graph on the upper side, overshooting of the frequency deviation is observed. The peak value of this overshooting was ±3 ppb.

Evaluation Test 1-2

Figure 9:
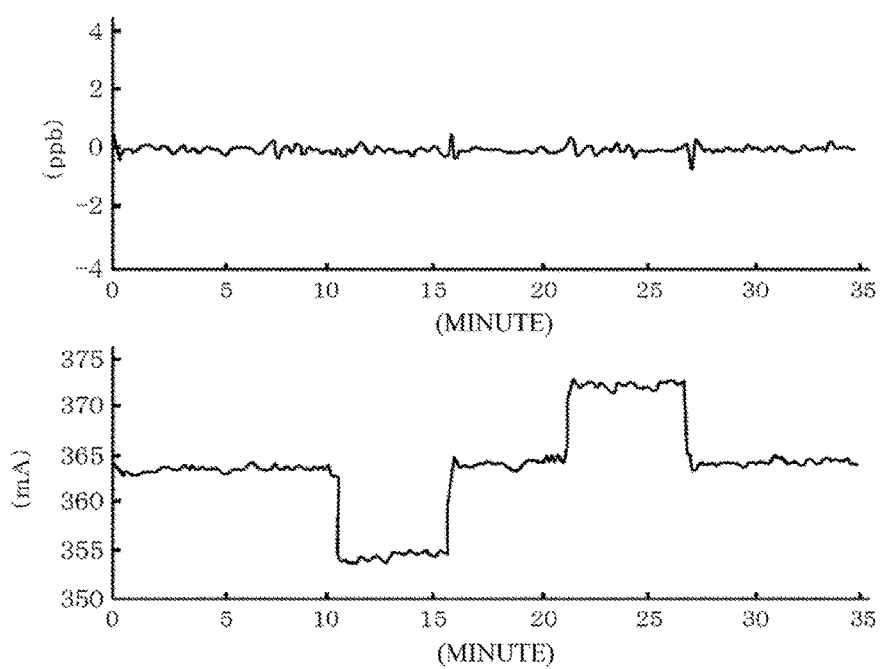
FIG. 9 is a graph illustrating a result of an evaluation test.

As the evaluation test 1-2, a test was performed in a similar condition to the evaluation test 1-1 using the OCXO 1 described in the first embodiment instead of the test OCXO. A graph in FIG. 9 illustrates the result of this evaluation test 1-2, and illustrates, similarly to FIG. 8, a state in which a frequency deviation fluctuates and a state in which a current output from the collector fluctuates. As apparent from the graph, in the evaluation test 1-2, overshooting of the frequency deviation was not observed, and a range in which the frequency deviation fluctuates was narrower than the range in which the frequency deviation fluctuates in the evaluation test 1-1. That is, it was shown that the OCXO 1 has a high stability in its output frequency by including the control voltage supply circuit 4.

Evaluation Test 2

In the heat control circuit 3 described in the first embodiment, the supply voltage Vcc supplied to the supply voltage input terminal 26 was caused to fluctuate in a range of 3.3 V±5% so as to draw a sine wave in a graph indicating this supply voltage on a vertical axis and a time on a horizontal axis, respectively. Then, the heater electric power P (=Vcc× I) of the PNP-type transistor 32 was measured while the supply voltage Vcc was thus fluctuated and an output from the PWM circuit 23 to the LPF 24 gradually increases.

Figure 10:
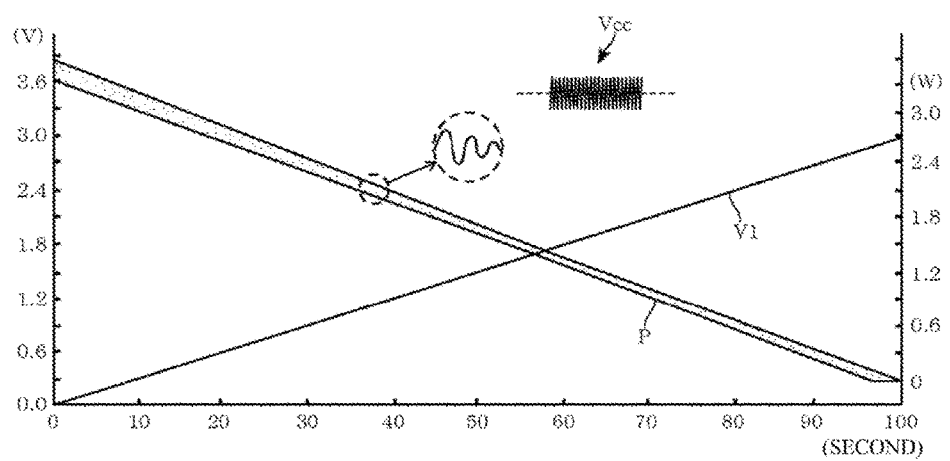
FIG. 10 is a graph illustrating a result of an evaluation test.

A graph in FIG. 10 illustrates the result of this evaluation test 2. A horizontal axis of the graph indicates an elapsed time (unit: second) from a predetermined time. A vertical axis indicates a voltage (unit: V) and an electric power (unit: W). In the graph, a state in which the supply voltage Vcc changes is illustrated only for a predetermined period, however, the fluctuation is continued at a similar period to the indicated period during the measurement of the heater electric power P. For ease of illustration, the heater electric power P is indicated as a polygonal with dots for the fluctuated range instead of indication by this graph line because the graph line is dense. As for a part of this polygonal, a part pointed by the arrow indicates a state of electric power change in the case where a scale interval of the horizontal axis of the graph is set larger.

As illustrated in the graph in FIG. 10, a width that the heater electric power P fluctuates differs according to the voltage V1, which is output from the LPF 24, and the fluctuation width of the electric power P is reduced to be narrow especially when the voltage V1 is in a range of 1.5 V to 2.1 V. In the OCXO 1, the voltage V1 changes in accordance with the ambient temperatures of the crystal resonators 11 and 12. This experimental result showed when a temperature inside the constant temperature oven of the OCXO 1 was set to be within a predetermined range, the fluctuation of the heater electric power P was reduced. Thus, the output frequency from the OCXO 1 was stabilized.

Evaluation Test 3

In the heat control circuit 3 described in the first embodiment, while the supply voltage Vcc supplied to the supply voltage input terminal 26 was caused to fluctuate such that a sine wave was drawn in a graph indicating this supply voltage on a vertical axis and a time on a horizontal axis, respectively, its value was gradually increased as well as the output voltage V1 supplied to the heat control circuit 3 from the LPF 24 was gradually increased. A voltage (the voltage V0 described above), a current I, and an electric power calculated from these voltage and current that were supplied to the collector of the PNP-type transistor 32 then were obtained. Also, a voltage, a current I, and an electric power calculated from these voltage and current that are supplied to the heating resistor RL were obtained. Measurement positions of these currents and voltages are indicated as points S and T in FIG. 2.

Figure 11:
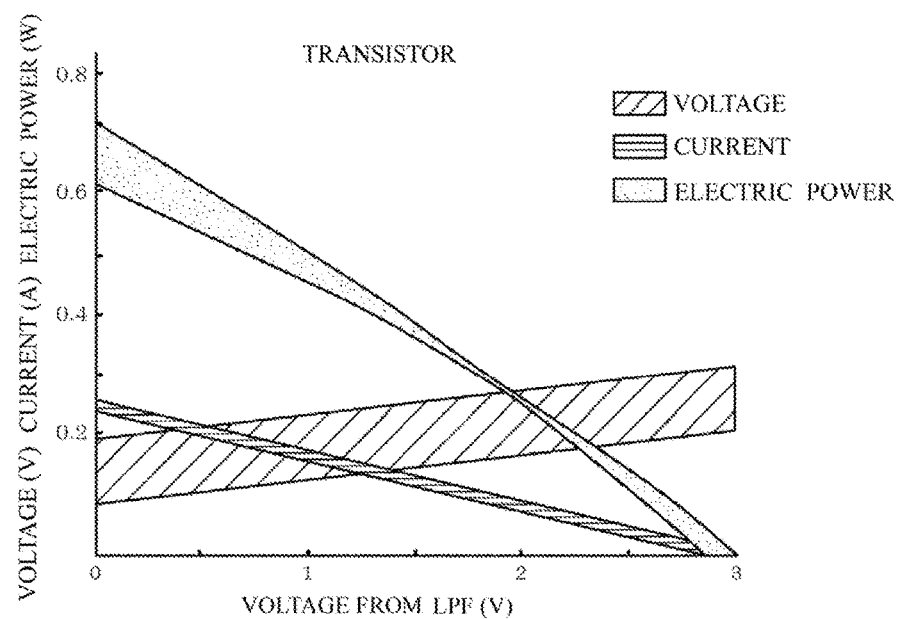
FIG. 11 is a graph illustrating a result of an evaluation test.
Figure 12:
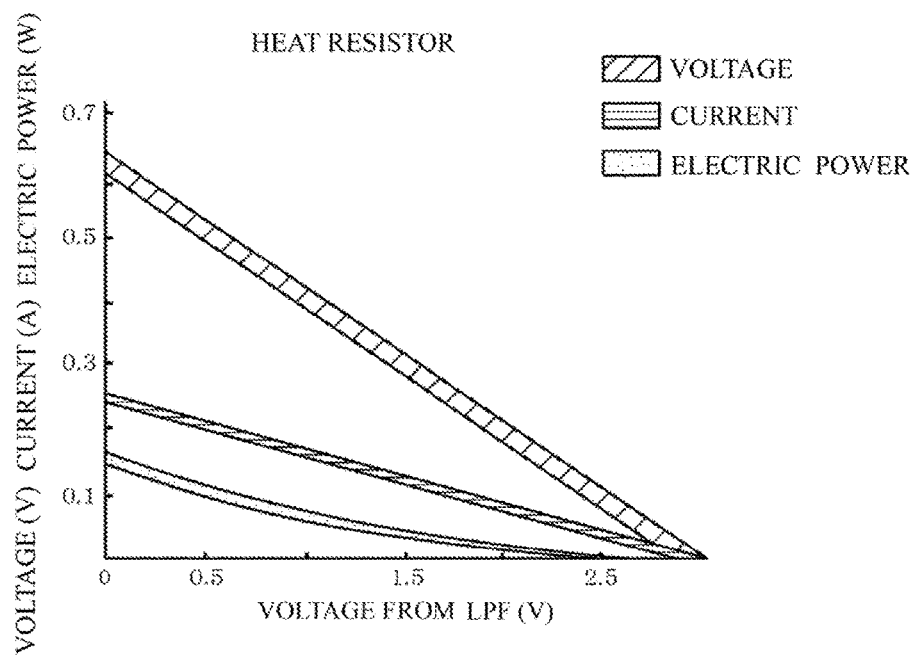
FIG. 12 is a graph illustrating a result of an evaluation test.

Graphs in FIG. 11 and FIG. 12 illustrate the results of this evaluation test 3. Horizontal axes of the graphs indicate the output voltages (unit: V) from the LPF 24. Vertical axes indicate respective voltages (unit: V), currents (unit: A), and electric powers (unit: W). FIG. 11 illustrates the voltage, the current, and the electric power supplied to the PNP-type transistor 32, and FIG. 12 illustrates the voltage, the current, and the electric power supplied to the heating resistor RL. However, the voltage supplied to the PNP-type transistor 32 that is illustrated in FIG. 11 is a value of (measured value−2)×0.2 for convenience. As for FIG. 11 and FIG. 12, since waveforms of each of the graphs are dense, areas where the voltage waveforms, the current waveforms, and the electric power waveforms are indicated are surrounded. In the surrounded areas, oblique lines, horizontal lines, and dots are each illustrated.

Figure 13:
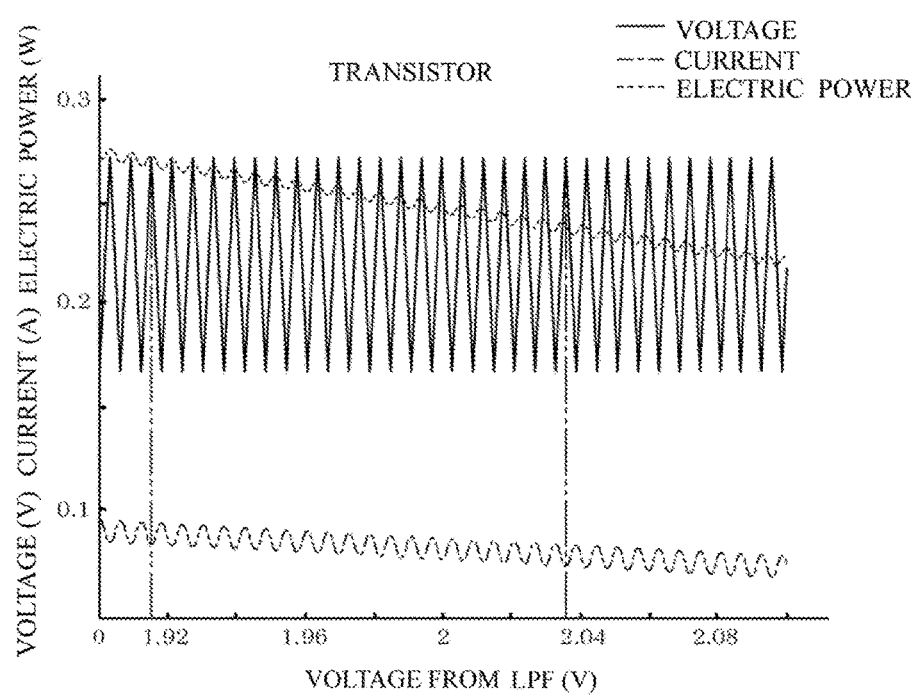
FIG. 13 is a graph illustrating a result of an evaluation test.
Figure 14:
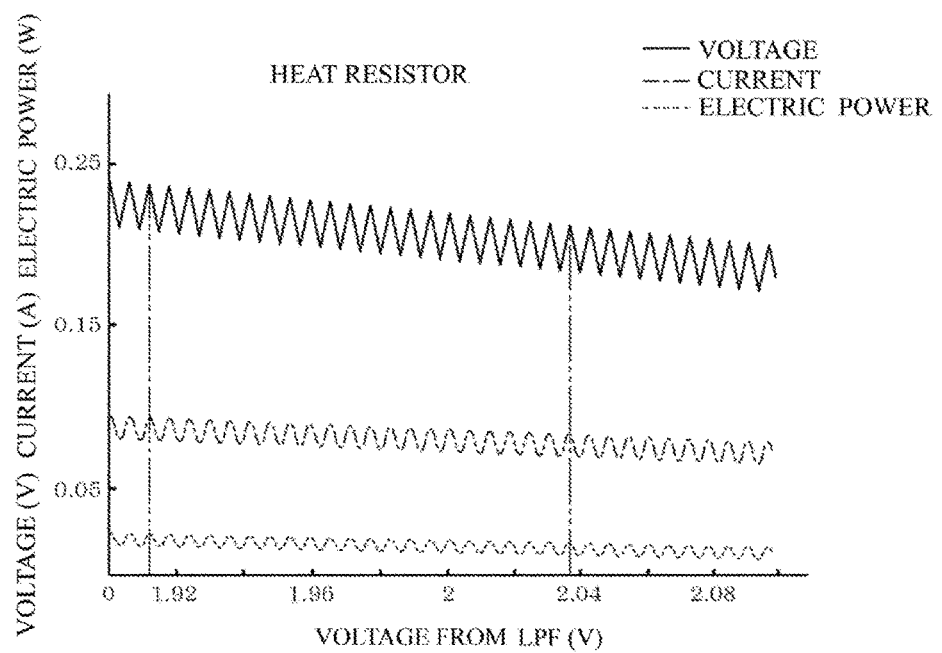
FIG. 14 is a graph illustrating a result of an evaluation test.

Graphs in FIG. 13 and FIG. 14 are enlarged views of the above-described waveforms of the voltages, the currents, and the electric powers within ranges of 1.90 V to 2.10 V of the output voltages in FIG. 11 and FIG. 12, respectively. In the graphs in FIG. 13 and FIG. 14, the voltages, the currents, and the electric powers are illustrated as solid lines, chain lines, and dotted lines, respectively. As illustrated in FIG. 13, with the PNP-type transistor 32, the waveform of the voltage and the waveform of the current fluctuate at a similar period, which is when the voltage increases the current decreases, and conversely, when the voltage decreases the current increases. That is, the fluctuation of the electric power of the PNP-type transistor 32 can be reduced as described in the embodiment. As illustrated in FIG. 14, with the heating resistor RL, the waveform of the voltage and the waveform of the current fluctuate at a similar period, and the voltage and the current increases and decreases together. That is, the electric power supplied to the heating resistor RL is different from the electric power supplied to the PNP-type transistor 32, and its value is not compensated to become constant. However, as illustrated in FIG. 13 and FIG. 14, the electric power supplied to the heating resistor RL is very small compared with the electric power supplied to the PNP-type transistor 32, therefore the heater electric power P receives a little influence from the heating resistor RL.

Figure 15:
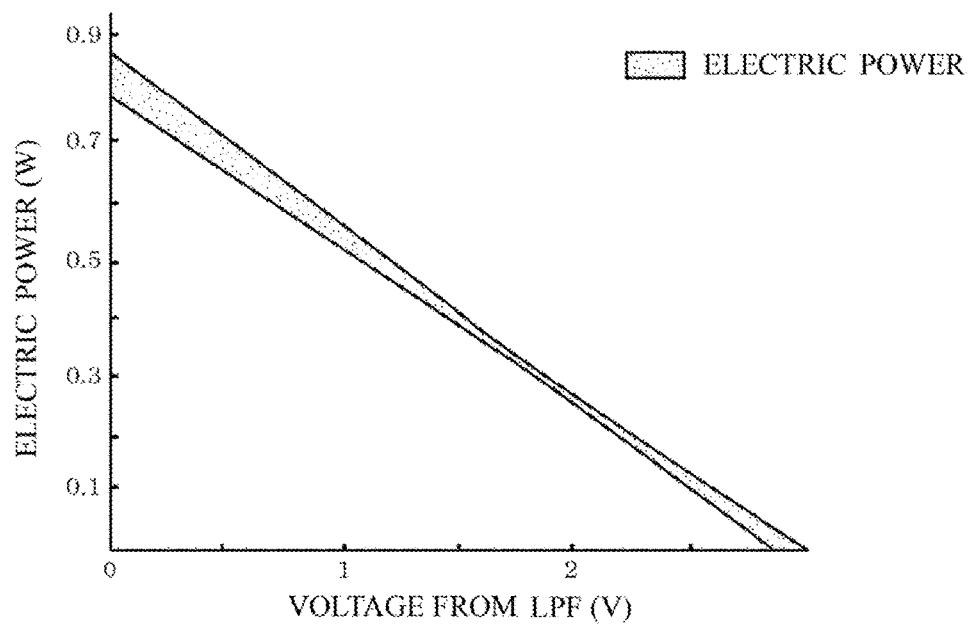
FIG. 15 is a graph illustrating a result of an evaluation test.

A graph in FIG. 15 illustrates the electric power supplied to the PNP-type transistor 32 illustrated in FIG. 11+the electric power supplied to the heating resistor RL illustrated in FIG. 12, that is, the heater electric power P. Similar to FIG. 11 and FIG. 12, a horizontal axis of the graph indicates the voltage V1 supplied from the LPF 24 and a vertical axis indicates this heater electric power P. When the voltage V1 is in the range of 1 V to 2.5 V, the fluctuation of the value of the heater electric power P is reduced to small, similar to the result of the evaluation test 2. That is, the fluctuation of the heater electric power P was reduced within a predetermined temperature range and effects of the disclosure were confirmed.

Evaluation Test 4

Figure 16:
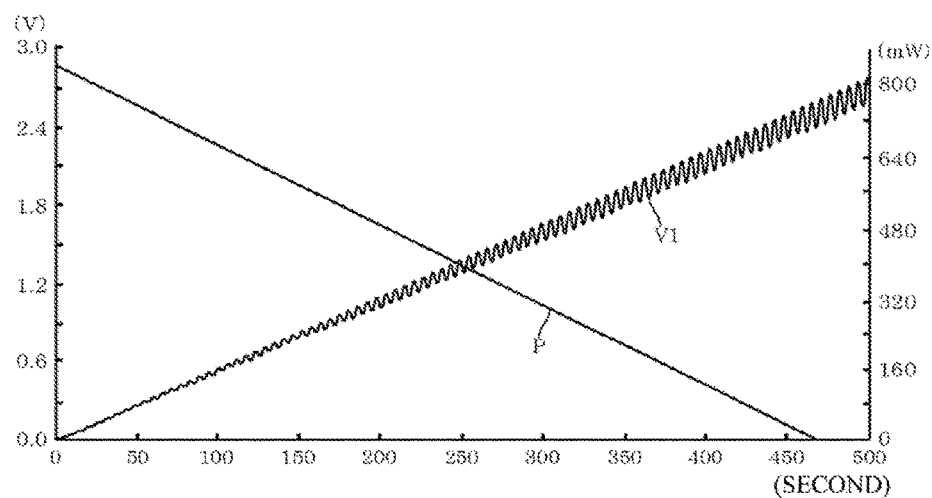
FIG. 16 is a graph illustrating a result of an evaluation test.

In the heat control circuit 50 of the OCXO 5 described in the second embodiment, the heater electric power P was measured while the supply voltage Vcc and the output voltage V1 (see FIG. 4) from the LPF 24 were caused to fluctuate, similar to the evaluation test 2. A graph in FIG. 16 illustrates the result of this evaluation test 4. In the graph in this FIG. 16 a unit of the measured heater electric power P is different from that of the graph in FIG. 10 of the evaluation test 2 and is mW. Since the supply voltage Vcc is caused to fluctuate such that the sine wave is drawn, the voltage V1 is different from the evaluation test 2 by receiving its influence and increases gradually as fluctuating in a wave shape as illustrated in the graph. During the measurement, the heater electric power P decreases as the time passes such that a primary straight line is drawn. That is, the fluctuation width of the heater electric power P caused by the fluctuation of the supply voltage Vcc is extremely small.

Both in this evaluation test 4 and the evaluation test 2, the voltage V1 is caused to fluctuate in a range of approximately 0 V to 3 V. Since this voltage V1 corresponds to the temperature detection value by the crystal resonators 11 and 12, the evaluation tests 2 and 4 measure the fluctuations of the heater electric power P under approximately similar size of the temperature range. The evaluation test 4 reduces the fluctuation of the heater electric power P with respect to the fluctuation of the voltage Vcc better than the evaluation test 2. Accordingly, it can be said that the OCXO 5 of the second embodiment ensures reducing the fluctuation of the heater electric power P in a wider range of temperature than the OCXO 1 of the first embodiment. Therefore, the OCXO 5 has the advantage of high degrees of freedom in the set temperature inside the constant temperature oven.

Evaluation Test 5

Figure 17:
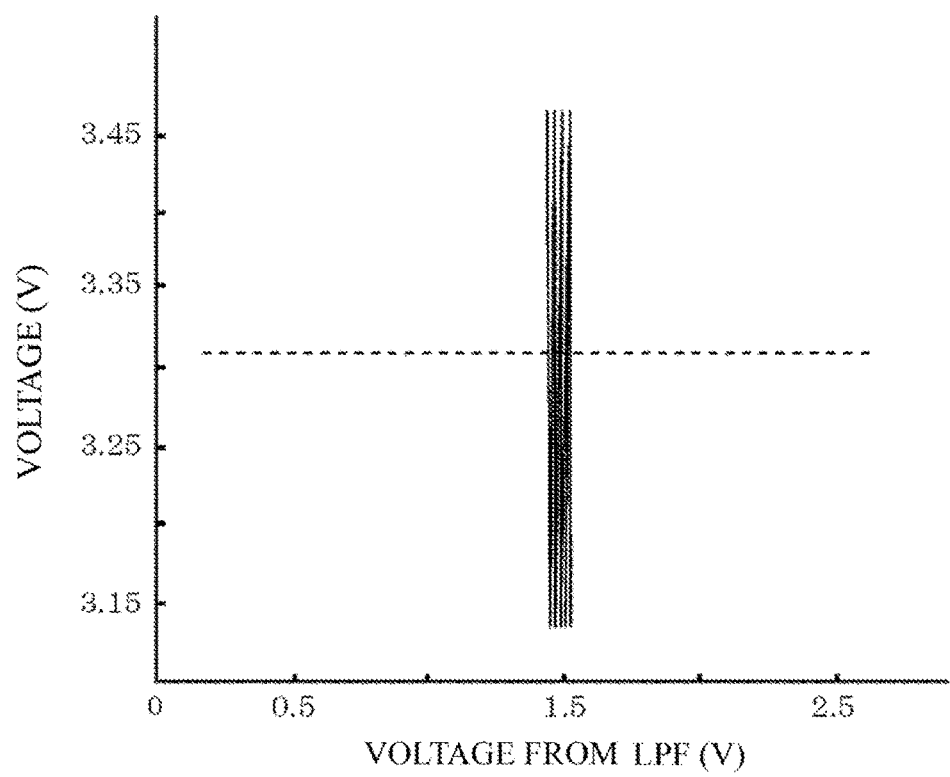
FIG. 17 is a graph illustrating a result of an evaluation test.

In the heat control circuit 50 described in the second embodiment, while the supply voltage Vcc supplied to the supply voltage input terminal 26 was caused to fluctuate in a graph indicating this supply voltage on a vertical axis and a time on a horizontal axis, respectively, such that a sine wave is drawn, the output voltage V1 from the LPF 24 was increased with time. FIG. 17 is a graph for this supply voltage Vcc, indicating the voltage V1 (unit: V) on a horizontal axis and the supply voltage Vcc on a vertical axis, respectively. For ease of illustration, only a part of the waveform is illustrated, but the supply voltage Vcc was caused to fluctuate periodically until the voltage V1 is caused to fluctuate to 0 V to 2.7 V. Thus, the electric power supplied to the PNP-type transistor 32 and the electric power supplied to the heating resistor RL were measured respectively when the supply voltage Vcc and the voltage V1 were caused to fluctuate.

Figure 18:
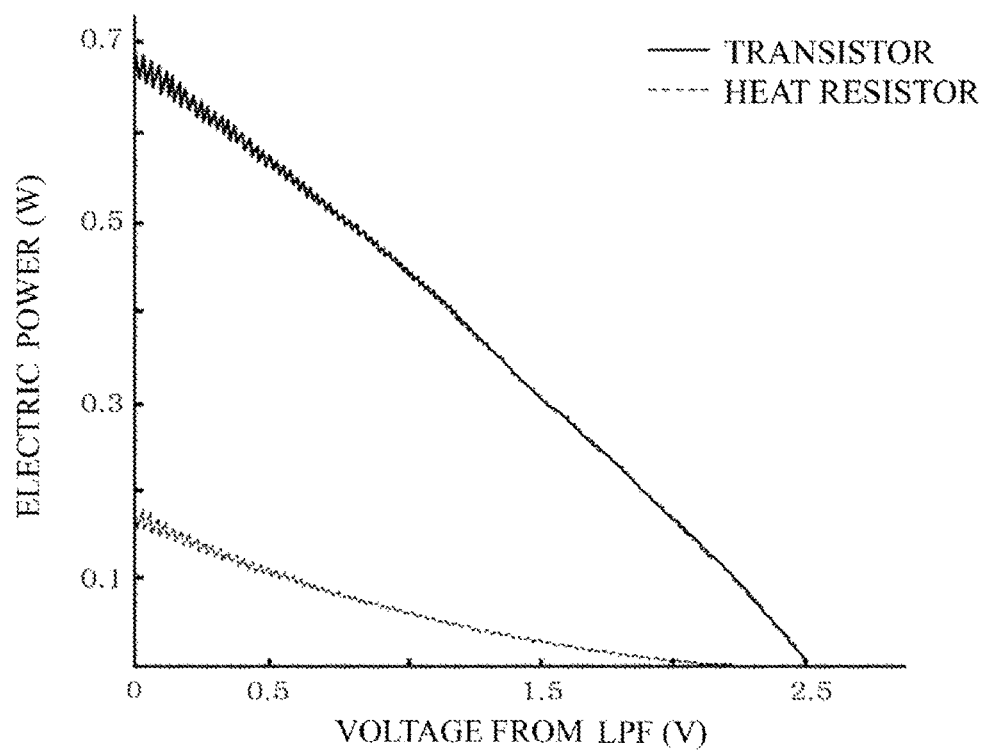
FIG. 18 is a graph illustrating a result of an evaluation test.
Figure 19:
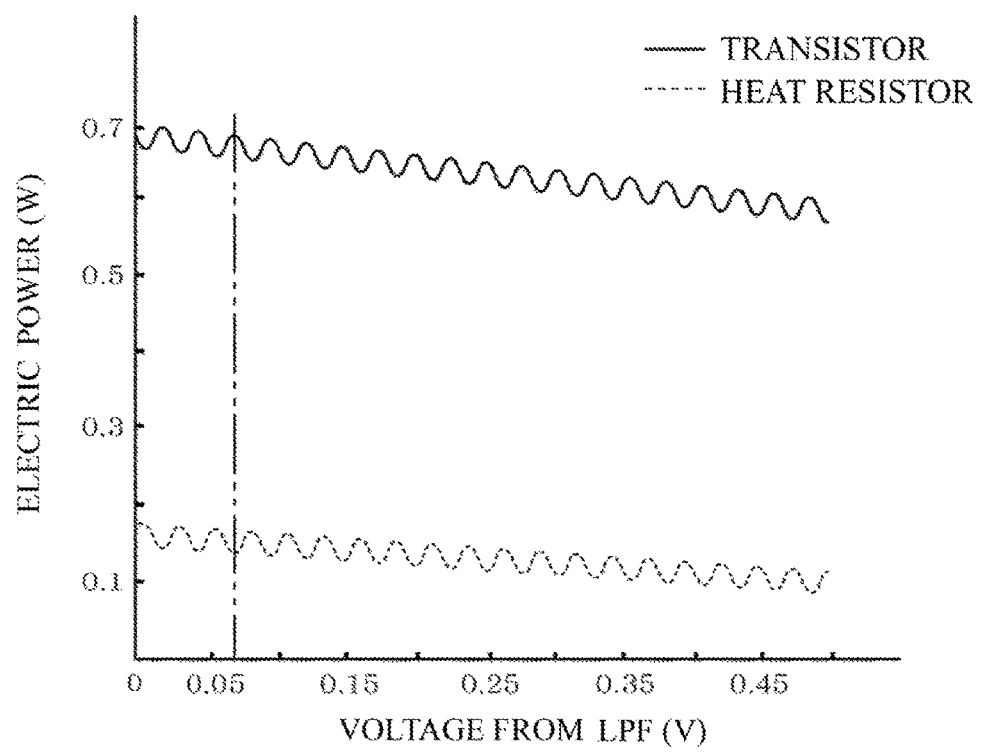
FIG. 19 is a graph illustrating a result of an evaluation test.

FIG. 18 and FIG. 19 are graphs illustrating the measurement results and indicating the electric powers supplied to the PNP-type transistor 32 and the heating resistor RL with a solid line and a dotted line, respectively. Horizontal axes and vertical axes of the graphs indicate the input voltage V1 (unit: V) and the electric power (unit: W), respectively. FIG. 19 illustrates the enlarged waveforms of each of the electric power in the graph in FIG. 18 when the input voltage V1 is in a range of 0 V to 0.5 V. As illustrated in this graph in FIG. 19, the electric power supplied to the PNP-type transistor 32 and the electric power supplied to the heating resistor RL fluctuate at similar periods. When the electric power supplied to the PNP-type transistor 32 increases, the electric power supplied to the heating resistor RL decreases, and conversely, when the electric power supplied to the PNP-type transistor 32 decreases, the electric power supplied to the heating resistor RL increases. That is, the fluctuation of the electric power of the PNP-type transistor 32 and the fluctuation of the electric power of the heating resistor RL are cancelling one another.

Figure 20:
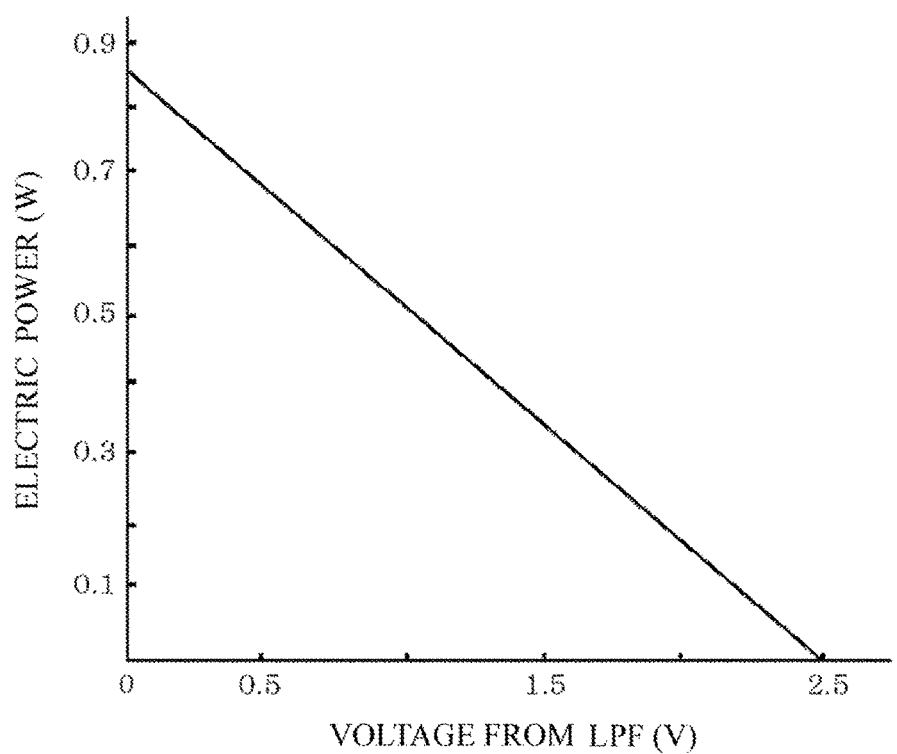
FIG. 20 is a graph illustrating a result of an evaluation test.

A graph in FIG. 20 illustrates the electric power supplied to the PNP-type transistor 32 as illustrated in FIG. 18+the electric power supplied to the heating resistor RL, namely, the heater electric power P. When the control voltage is in a range of 0 V to 2.5 V, the fluctuation of the heater electric power P is reduced. The heater electric power P decreases approximately linearly as the control voltage increases. Therefore, as for the second embodiment, it was confirmed that the fluctuation of the heater electric power P was reduced in a wide range of temperature.

Third Embodiment

Figure 21:
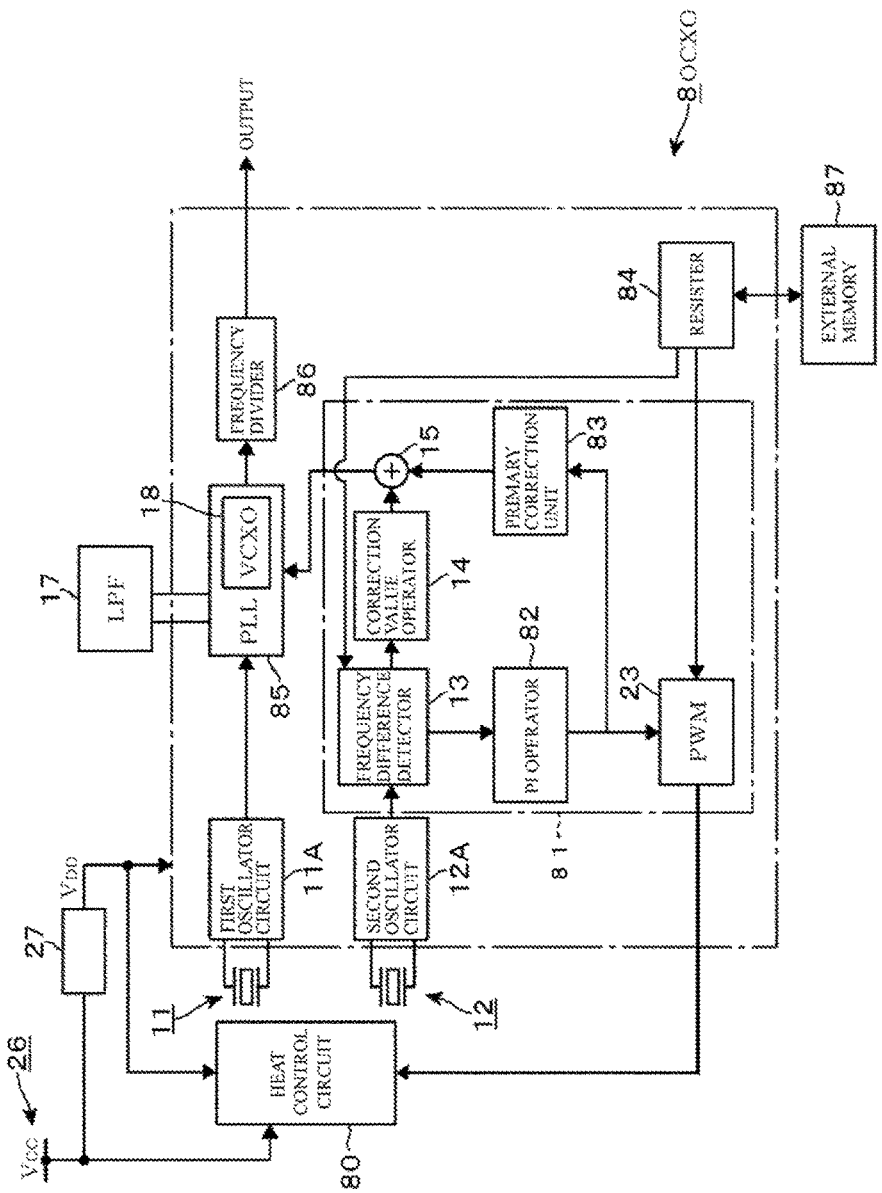
FIG. 21 is a block diagram illustrating an OCXO of a third embodiment.

An OCXO 8 according to a third embodiment will be described with reference to FIG. 21 focusing on differences with the OCXO 5 of the second embodiment. This OCXO 8 includes a Digital Signal Processor (DSP) block 81 and a frequency divider 86. The DSP block 81 includes a PI operator 82 and a primary correction unit 83, as well as the frequency difference detector 13, the correction value operator 14, the addition unit 15, and the Pulse width Modulation (PWM) circuit 23, which are described above. The OCXO 8 denotes the memory 10 illustrated in FIG. 1 as a register 84 and the PLL circuit unit 16 and the VCXO 18, which are described above, as one PLL block 85. An output of the PLL block 85 is an output of the above-described VCXO 18. This output of the VCXO 18 is divided by the frequency divider 86 to become the output of this OCXO 8.

The DSP block 81, the first oscillator circuit 11A, the second oscillator circuit 12A, the PLL block 85, the register 84, and the frequency divider 86 are formed within the integrated circuit 25, which is one LSI. The VCXO 18 includes a crystal resonator since it is a crystal controlled oscillator, and this crystal resonator is disposed outside the integrated circuit 25, but its illustration is omitted. Similar to the first and the second embodiment, the integrated circuit 25 is applied with a voltage (VDD) via the regulator 27. An external memory 87 is disposed outside the integrated circuit 25. The external memory 87 stores respective parameters to operate the OCXO 8. For example, these parameters are read into the register 84 when the power source of the OCXO 8 is turned on, then these parameters are output from the register 84 to respective units of the OCXO 8 such as the frequency difference detector 13 and the PWM circuit 23, and are configured. While the OCXO 1 and 5 of the first and the second embodiments similarly have the respective parameters read from the external memory 87 configured to the respective units, the external memory 87 are not illustrated in each of other drawings.

The DSP block 81 is disposed in a latter part side of the first oscillator circuit 11A and the second oscillator circuit 12A. Describing operation of this DSP block 81, the temperature detection value ΔF output from the frequency difference detector 13 is input to the PI operator 82 and the correction value operator 14. The PI operator 82 outputs a calculation value (referred to as a PI calculation value) by integrating the temperature detection value ΔF. The PI calculation value is input to the PWM circuit 23 and the primary correction unit 83. At the primary correction unit 83, the PI calculation value is multiplied by coefficient and a setting value is added to the multiplication value. At the addition unit 15, the above-described output value of the primary correction unit 83 and the frequency correction value calculated at the correction value operator 14 are added.

The output signal from the addition unit 15 consequently becomes the frequency setting signal to be input to the DDS circuit unit included in the PLL block 85, then the reference clock of the PLL is output from the DDS circuit unit. Since the above-described PI calculation value fluctuates proportionally, for example, to a temperature change, the output of the primary correction unit 83 is the output corresponding to the temperature change. Outputting the frequency setting signal on the basis of this output of the primary correction unit 83 ensures reducing the fluctuation of the reference clock caused by the temperature change with more certainty.

This OCXO 8 includes a heat control circuit 80 instead of the heat control circuit 50 of the second embodiment. The output of the PWM circuit 23 is supplied to this heat control circuit 80. This heat control circuit 80 will be described with reference to FIG. 22 focusing on differences with the heat control circuit 50 illustrated in FIG. 4. The heat control circuit 80 includes the buffer amplifier 53, a supply voltage supply circuit 89, the LPF 24, and a heat generation circuit 90. Similar to the heat control circuit 50, the output from the PWM circuit 23 is input to the heat generation circuit 90 via the buffer amplifier 53 and the LPF 24 in this order. Similar to the second embodiment, a gain of the buffer amplifier 53 is controlled on the basis of the output of the supply voltage supply circuit 89.

The supply voltage supply circuit 89 is constituted approximately similarly to the supply voltage supply circuit 60 illustrated in FIG. 4. Describing with focusing on the differences, the supply voltage supply circuit 89 includes resistors 91 and 92 connected to one another in series between the supply voltage input terminal 26 of Vcc, the positive voltage, and the earth. The supply voltage supply circuit 89 is configured to be supplied with the supply voltage Vcc, have one end of the signal path 43 connected to the input terminal on the − side of the differential amplifier (the first differential amplifier) 62 grounded and the other end of this signal path 43 connected between the resistors 91 and 92 via the resistor 61.

Describing the heat generation circuit 90, the heat generation circuit 90 is constituted of an NPN-type transistor 93, a PNP-type transistor 94, and the heating resistor RL. The LPF 24 is connected to a base of the NPN-type transistor 93 and a collector of the NPN-type transistor 93 is connected to a base of the PNP-type transistor 94. An emitter of the NPN-type transistor 93 and a collector of the PNP-type transistor 94 are connected to one another and grounded via the heating resistor RL. That is, an inverted Darlington connection of the NPN-type transistor 93 and the PNP-type transistor 94 is made, thereby a heat generation amount is increased. The emitter of the PNP-type transistor 94 is connected with the supply voltage input terminal 26 and applied with the supply voltage Vcc. A signal path from the PWM circuit 23 to an PNP-type transistor 94 corresponds to a signal path of a control signal generated on the basis of the temperature detection value.

When supply voltage Vcc increases, the voltage applied to the input terminal on the − side of the differential amplifier 62 in the supply voltage supply circuit 89 increases and the output from this differential amplifier 62 decreases. This causes the control voltage supplied from the buffer amplifier 53 to the base of the NPN-type transistor 93 via the LPF 24 to decrease. The decrease of the control voltage decreases the respective current supplied to the collector of the NPN-type transistor 93, the emitter of the PNP-type transistor 94, and the heating resistor RL, therefore the increase of the heater electric power is reduced. The heater electric power is a product of the current supplied to the collector of the NPN-type transistor 93 and the voltage applied to this collector, a product of the current supplied to the emitter of the PNP-type transistor 94 and the voltage applied to this emitter, and a product of the current supplied to the resistor RL and the voltage supplied to this resistor RL are added to one another.

When the supply voltage Vcc decreases, the voltage applied to the input terminal on the − side of the differential amplifier 62 decreases and the output from this differential amplifier 62 increases. This causes the control voltage supplied from the buffer amplifier 53 to the base of the NPN-type transistor 93 via the LPF 24 increases. The increase of the control voltage increases the respective current supplied to the collector of the NPN-type transistor 93, the emitter of the PNP-type transistor 94, and the heating resistor RL, therefore the decrease of the heater electric power is reduced.

Thus, the current supplied to the NPN-type transistor 93, the PNP-type transistor 94, and the heating resistor RL change so as to compensate the fluctuation of Vcc, and similar to the OCXO 5, the fluctuation of the heater electric power is reduced and kept constant. That is, the temperature change inside the constant temperature oven constituting the OCXO 8 caused by the fluctuation of Vcc is reduced. Furthermore, as described above, at the DSP block 81, the frequency setting signal corresponding to the temperature change is generated to be output to the PLL block 85, and the reference clock of the PLL is generated from the DDS circuit unit included in the PLL block 85 on the basis of the frequency setting signal. Therefore, in the OCXO 8, the output fluctuation is reduced with more certainty.

Figure 23:
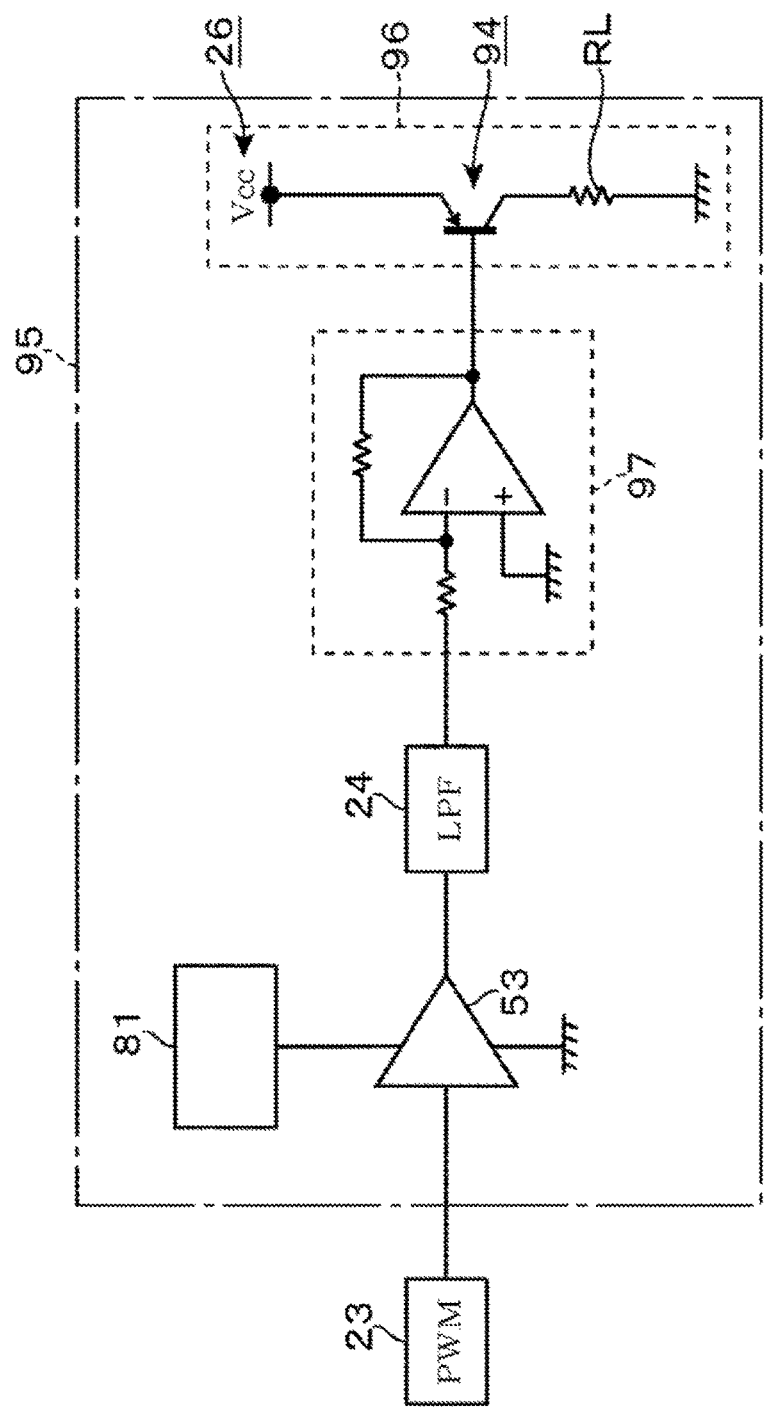
FIG. 23 is a block diagram illustrating a modification of the heat control circuit

The transistor connected to the buffer amplifier 53 is not limited to be the NPN type. FIG. 23 illustrates a heat control circuit 95 that is a modification of the heat control circuit 80. This heat control circuit 95 includes a heat generation circuit 96 instead of the heat generation circuit 90. The LPF 24 and the heat generation circuit 96 are connected via an inverting amplifier circuit 97. When the supply voltage Vcc decreases and the output from the buffer amplifier 53 to the LPF 24 increases, the output from the inverting amplifier circuit 97 to the heat generation circuit 96 is configured to decrease. The heat generation circuit 96 does not include the NPN-type transistor 93, which is different from the heat generation circuit 90, but is constituted of the PNP-type transistor 94 and the heating resistor RL. The base of the PNP-type transistor 94 is connected to the inverting amplifier circuit 97. The lower the output from the inverting amplifier circuit 97 is, the larger the current supplied from the supply voltage input terminal 26 of the supply voltage Vcc to the emitter of the PNP-type transistor 94 and the heating resistor RL becomes. That is, in the case where the supply voltage Vcc decreases as described above, the current supplied to the emitter of the PNP-type transistor 94 and the heating resistor RL increases, thus reducing the fluctuation of the heater electric power.

[Evaluation Test]

Evaluation Test 6

Figure 22:
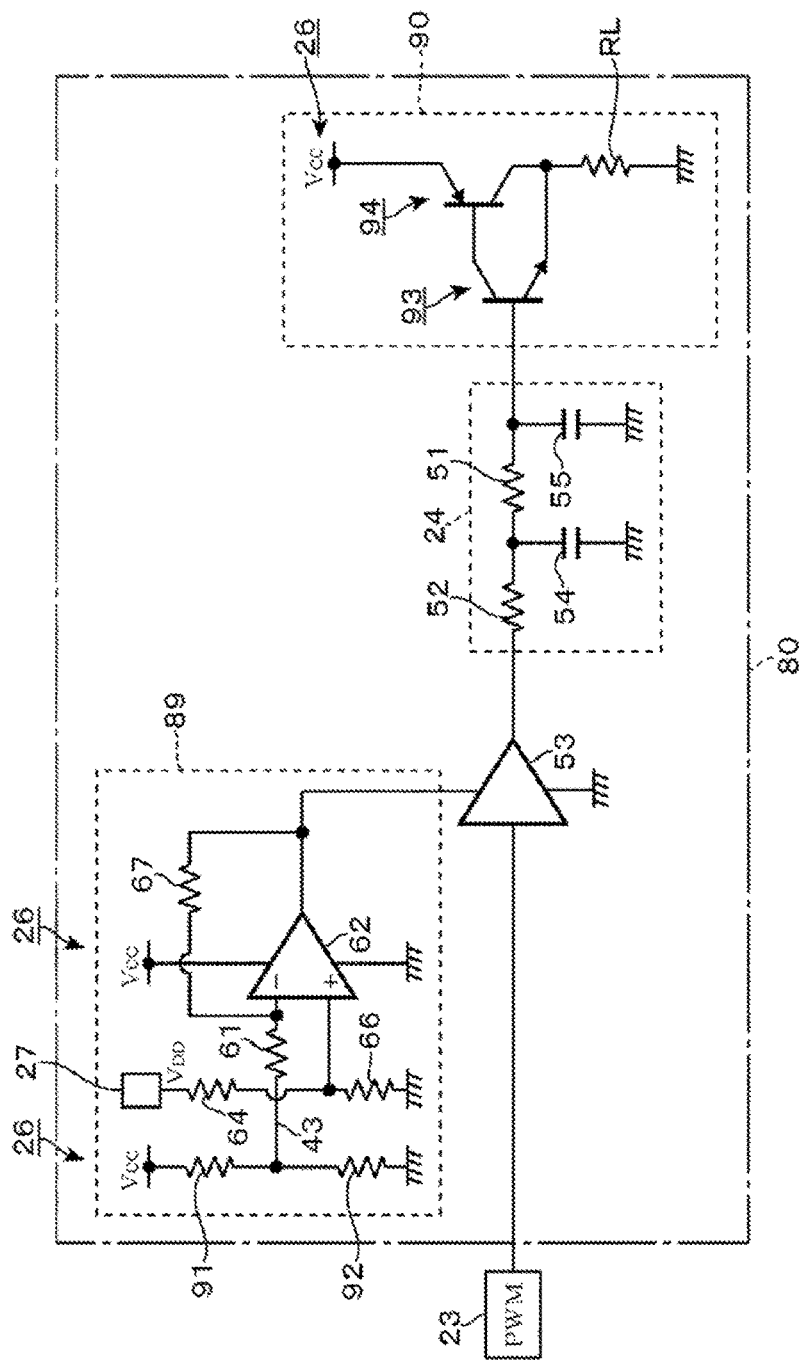
FIG. 22 is a block diagram illustrating a heat control circuit included in the third embodiment.
Figure 24:
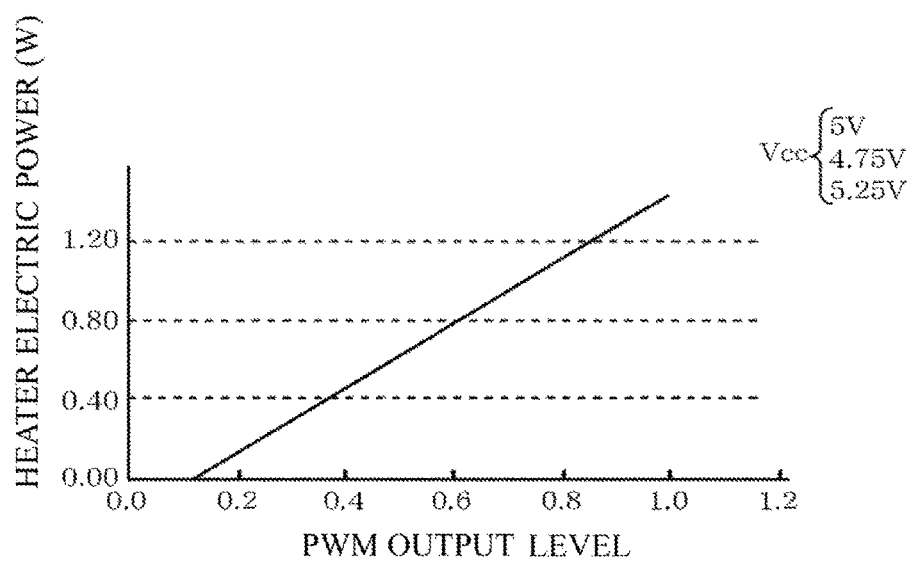
FIG. 24 is a graph illustrating a result of an evaluation test.

As the evaluation test 6-1, in the heat control circuit 80 described in FIG. 22, an output level from the PWM circuit 23 was changed and the heater electric power (unit: W) was measured. The supply voltage Vcc was changed every time the measurement was performed and set to 5 V, 4.75 V, and 5.25 V, respectively, for the respective measurements. FIG. 24 is a graph illustrating this measurement result. A horizontal axis and a vertical axis of this graph indicate the output level of the PWM circuit 23 and the heater electric power, respectively. In the case where Vcc is at 5 V, 4.75 V, and 5.25 V, shape of the graph was approximately similar. That is, this heat control circuit 80 reduces the fluctuation of the heater electric power caused by the change of the supply voltage Vcc.

Figure 25:
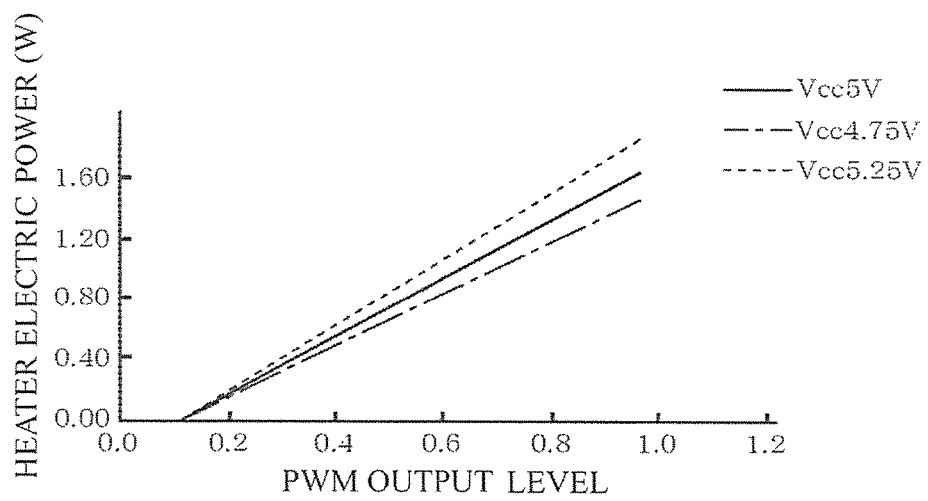
FIG. 25 is a graph illustrating a result of an evaluation test.

As the evaluation test 6-2, in a circuit configured to supply the output of the PWM circuit 23 to the LPF 24 without interposing the buffer amplifier 53 and from this LPF 24 to the heat generation circuit 90, the output level from the PWM circuit 23 was changed and the heater electric power (unit: W) was measured, similar to the evaluation test 6-1. The supply voltage Vcc was changed every time the measurement is performed in a similar manner to the evaluation test 6-1. FIG. 25 is a graph illustrating the result of the evaluation test 6-2, similar to the evaluation test 6-1. The graphs of each of the supply voltages Vcc incline differently. As the output level of the PWM circuit 23 becomes large, the differences of the heater electric powers between each of the supply voltages Vcc become large. From the results of the evaluation tests 6-1 and 6-2, it is known that disposing the buffer amplifier 53 and the supply voltage supply circuit 89 is effective in reducing the fluctuation of the heater electric power.

The invention claimed is:

1. An oscillator that detects a temperature of an atmosphere where a crystal resonator providing an oscillation output is placed using a temperature detector to stabilize the temperature by controlling a temperature of a heater based on a temperature detection value, the oscillator comprising:
   a buffer amplifier interposed in a signal path of a control signal generated based on the temperature detection value;
   a heater constituted of a transistor having a collector and an emitter positioned between a power source unit and a ground, and a base connected to an output port of the buffer amplifier; and
   a first differential amplifier disposed to adjust a gain of the buffer amplifier so as to cancel a voltage fluctuation of the power source unit, the first differential amplifier amplifying a difference between a voltage corresponding to a voltage of the power source unit and a preliminarily set voltage to input to a gain adjustment port of the buffer amplifier.

2. The oscillator according to claim 1, wherein the heater includes a heat resistor disposed between the power source unit supplying a positive voltage and the ground.

3. The oscillator according to claim 2, comprising a voltage fluctuation reducing unit including a second differential amplifier disposed in an output side of the buffer amplifier, the second differential amplifier receiving the voltage corresponding to the voltage of the power source unit and a voltage of the output side of the buffer amplifier respectively at one end and another end of a positive input port and a negative input port thereof, the second differential amplifier having an output port connected to the base of the transistor, the voltage fluctuation reducing unit being configured to apply a current to the transistor so as to cancel the voltage fluctuation of the power source unit.

4. The oscillator according to claim 3, wherein:
   the transistor is a PNP-type transistor having the emitter connected to the power source unit via the heat resistor and the collector grounded, and
   a constant voltage supply unit for supplying the preliminarily set voltage via a first voltage dividing resistor and a second voltage dividing resistor connected in series is connected to between the heat resistor and the emitter, wherein
   the oscillator includes:
      a third voltage dividing resistor interposed in a signal path of a control signal at a latter part of the buffer amplifier, the third voltage dividing resistor being connected to a positive input port of the second differential amplifier, and
      a fourth voltage dividing resistor connected to between the power source unit and the heat resistor and between the positive input port of the second differential amplifier and the third voltage dividing resistor, wherein
   a negative input port of the differential amplifier is connected to between the first voltage dividing resistor and the second voltage dividing resistor.

5. An oscillator that detects a temperature of an atmosphere where a crystal resonator providing an oscillation output is placed using a temperature detector to stabilize the temperature by controlling a temperature of a heater based on a temperature detection value, the oscillator comprising:
   an addition unit that takes out a difference between the temperature detection value and a temperature target value;
   a heater constituted of a heat resistor connected to a power source unit supplying a positive voltage and a PNP-type transistor having an emitter connected to the power source unit via the heat resistor and a collector grounded;
   a constant voltage supply unit for supplying a preliminarily set voltage;
   a differential amplifier having an output port connected to a base of the PNP-type transistor;
   a first voltage dividing resistor and a second voltage dividing resistor disposed connected in series with one another between the constant voltage supply unit and between the heat resistor and the emitter;
   a third voltage dividing resistor interposed between the addition unit and a positive input port of the differential amplifier; and
   a fourth voltage dividing resistor connected to between the power source unit and the heat resistor and between the positive input port of the differential amplifier and the third voltage dividing resistor, wherein
   a negative input port of the differential amplifier is connected to between the first voltage dividing resistor and the second voltage dividing resistor.

6. The oscillator according to claim 1, wherein the temperature detector includes a first crystal resonator and a second crystal resonator, a first oscillator circuit and a second oscillator circuit respectively connected to the first crystal resonator and the second crystal resonator, and a frequency difference detector that takes out a signal corresponding to a difference of oscillation frequencies of the first oscillator circuit and the second oscillator circuit as a temperature detection value.

7. The oscillator according to claim 6, wherein the crystal resonator for the oscillation output doubles as the first crystal resonator.

8. The oscillator according to claim 1, comprising
a voltage fluctuation reducing unit including a second differential amplifier disposed in an output side of the buffer amplifier, the second differential amplifier receiving the voltage corresponding to the voltage of the power source unit and a voltage of the output side of the buffer amplifier respectively at one end and another end of a positive input port and a negative input port thereof, the second differential amplifier having an output port connected to the base of the transistor, the voltage fluctuation reducing unit being configured to apply a current to the transistor so as to cancel the voltage fluctuation of the power source unit.

9. The oscillator according to claim 8, wherein:
the transistor is a PNP-type transistor having the emitter connected to the power source unit via a heat resistor of the heater and the collector grounded, and
a constant voltage supply unit for supplying the preliminarily set voltage via a first voltage dividing resistor and a second voltage dividing resistor connected in series is connected to between the heat resistor and the emitter, wherein
the oscillator includes:
  a third voltage dividing resistor interposed in a signal path of a control signal at a latter part of the buffer amplifier, the third voltage dividing resistor being connected to a positive input port of the second differential amplifier, and
  a fourth voltage dividing resistor connected to between the power source unit and the heat resistor and between the positive input port of the second differential amplifier and the third voltage dividing resistor, wherein
a negative input port of the differential amplifier is connected to between the first voltage dividing resistor and the second voltage dividing resistor.

* * * * *